US012416674B2

(12) United States Patent
Woo et al.

(10) Patent No.: US 12,416,674 B2
(45) Date of Patent: Sep. 16, 2025

(54) ELECTRONIC DEVICE AND METHOD OF DISPLAYING INFORMATION OF A PLURALITY OF BATTERIES USING THE SAME

(71) Applicant: SAMSUNG ELECTRONICS CO., LTD., Suwon-si (KR)

(72) Inventors: Kwangtaek Woo, Suwon-si (KR); Jaeho Choi, Suwon-si (KR); Changho Lee, Suwon-si (KR); Seonghun Kim, Suwon-si (KR); Jinwan An, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 247 days.

(21) Appl. No.: 18/118,429

(22) Filed: Mar. 7, 2023

(65) Prior Publication Data

US 2023/0280401 A1 Sep. 7, 2023

Related U.S. Application Data

(63) Continuation of application No. PCT/KR2023/000351, filed on Jan. 9, 2023.

(30) Foreign Application Priority Data

Mar. 2, 2022 (KR) .................. 10-2022-0026980
Apr. 15, 2022 (KR) .................. 10-2022-0047010

(51) Int. Cl.
*G08B 21/00* (2006.01)
*G01R 31/36* (2020.01)
(Continued)

(52) U.S. Cl.
CPC ....... *G01R 31/3646* (2019.01); *G01R 31/387* (2019.01); *G01R 31/392* (2019.01);
(Continued)

(58) Field of Classification Search
CPC .............. G01R 31/3646; G01R 31/387; G01R 31/392; G06F 1/1635; G06F 1/1677;
(Continued)

(56) References Cited

U.S. PATENT DOCUMENTS 8,433,373 B2   4/2013   Song et al.
9,351,237 B2   5/2016   Selim
(Continued)

FOREIGN PATENT DOCUMENTS

CN    110213406    *  9/2019   ............ H04M 1/026
CN    209692815 U    11/2019
(Continued)

OTHER PUBLICATIONS

International Search Report dated Mar. 30, 2023 issued by the International Searching Authority in counterpart International Application No. PCT/KR2023/000351.
(Continued)

*Primary Examiner* — Tai T Nguyen
(74) *Attorney, Agent, or Firm* — Sughrue Mion, PLLC

(57) ABSTRACT

Provided is an electronic device including a hinge module; a first and second housing; a first battery detachably disposed in a first internal space of the first housing, a second battery detachably disposed in a second internal space of the second housing; a first and second cover, a memory, and a processor. The processor is configured to execute instructions stored in the memory to display integrated battery information on first and second batteries, based on remaining capacity information on the first sand second batteries, display first battery information and second battery information based on detecting that at least one of the remaining capacity of the first and second batteries is equal to or less than a predetermined capacity, or based on detecting a detachment of the first or second cover.

20 Claims, 10 Drawing Sheets

(51) Int. Cl.
*G01R 31/387* (2019.01)
*G01R 31/392* (2019.01)
*G06F 1/16* (2006.01)

(52) U.S. Cl.
CPC .......... *G06F 1/1635* (2013.01); *G06F 1/1677* (2013.01); *G06F 1/1616* (2013.01)

(58) Field of Classification Search
CPC .......... G06F 1/1616; G06F 1/16; G06F 11/32; G06F 1/1652; Y02E 60/10; H02J 7/00
USPC ..................................................... 340/636.15
See application file for complete search history.

(56) References Cited

U.S. PATENT DOCUMENTS

| | | | |
|---|---|---|---|
| 10,211,652 | B2 | 2/2019 | Kwon et al. |
| 11,133,535 | B2 | 9/2021 | Kim et al. |
| 11,715,960 | B2 | 8/2023 | Gao et al. |
| 11,899,886 | B2 | 2/2024 | Yamazaki et al. |
| 2008/0065246 | A1* | 3/2008 | Zorkendorfer .......... G06F 1/163 700/94 |
| 2009/0104949 | A1* | 4/2009 | Sato .................... H04M 1/0214 439/449 |
| 2011/0009172 | A1 | 1/2011 | Thielman et al. |
| 2011/0178745 | A1 | 7/2011 | Kobayashi |
| 2013/0013942 | A1 | 1/2013 | Koshimizu |
| 2017/0207829 | A1* | 7/2017 | Morris ..................... H01Q 5/50 |
| 2018/0095502 | A1* | 4/2018 | Yamazaki ............ H10K 59/121 |
| 2020/0266627 | A1 | 8/2020 | Ha et al. |
| 2022/0060032 | A1 | 2/2022 | Jeong et al. |

FOREIGN PATENT DOCUMENTS

| | | | | |
|---|---|---|---|---|
| EP | 4459424 | * | 11/2024 | ........... G06F 1/1683 |
| JP | 2007-12360 | A | 1/2007 | |
| JP | 2009-103564 | A | 5/2009 | |
| JP | 2014-55816 | A | 3/2014 | |
| JP | 2014-146456 | A | 8/2014 | |
| KR | 20-1999-0034120 | U | 8/1999 | |
| KR | 10-2011-0004618 | A | 1/2011 | |
| KR | 10-1583383 | B1 | 1/2016 | |
| KR | 10-2017-0003081 | A | 1/2017 | |
| KR | 10-2019-0001830 | A | 1/2019 | |
| KR | 10-2020-0101174 | A | 8/2020 | |
| KR | 10-2020-0127740 | A | 11/2020 | |
| KR | 10-2021-0013852 | A | 2/2021 | |
| KR | 10-2021-0041985 | A | 4/2021 | |

OTHER PUBLICATIONS

Communication issued Feb. 17, 2025 by the European Patent Office in European Patent Application No. 23763604.8.

* cited by examiner

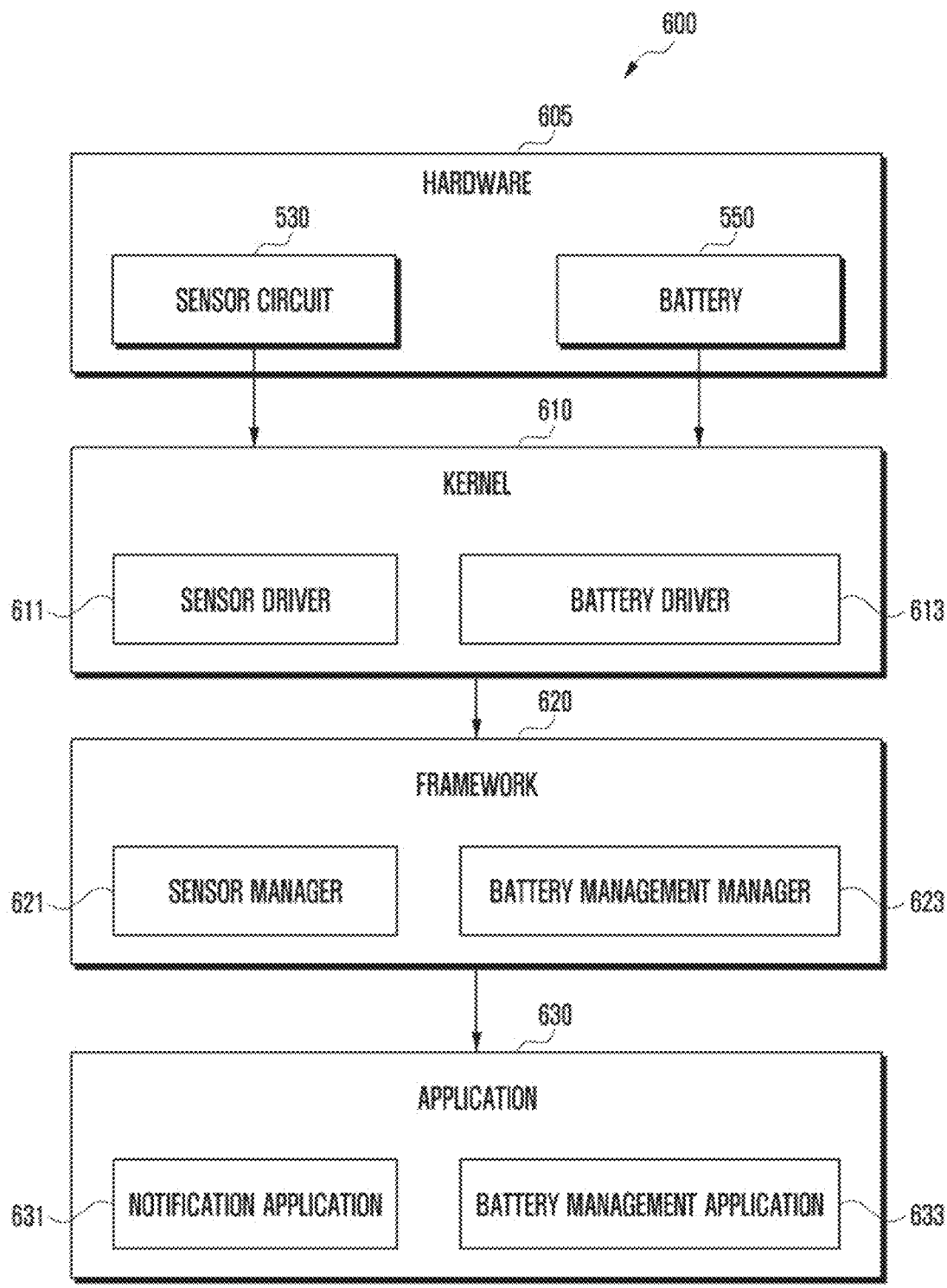

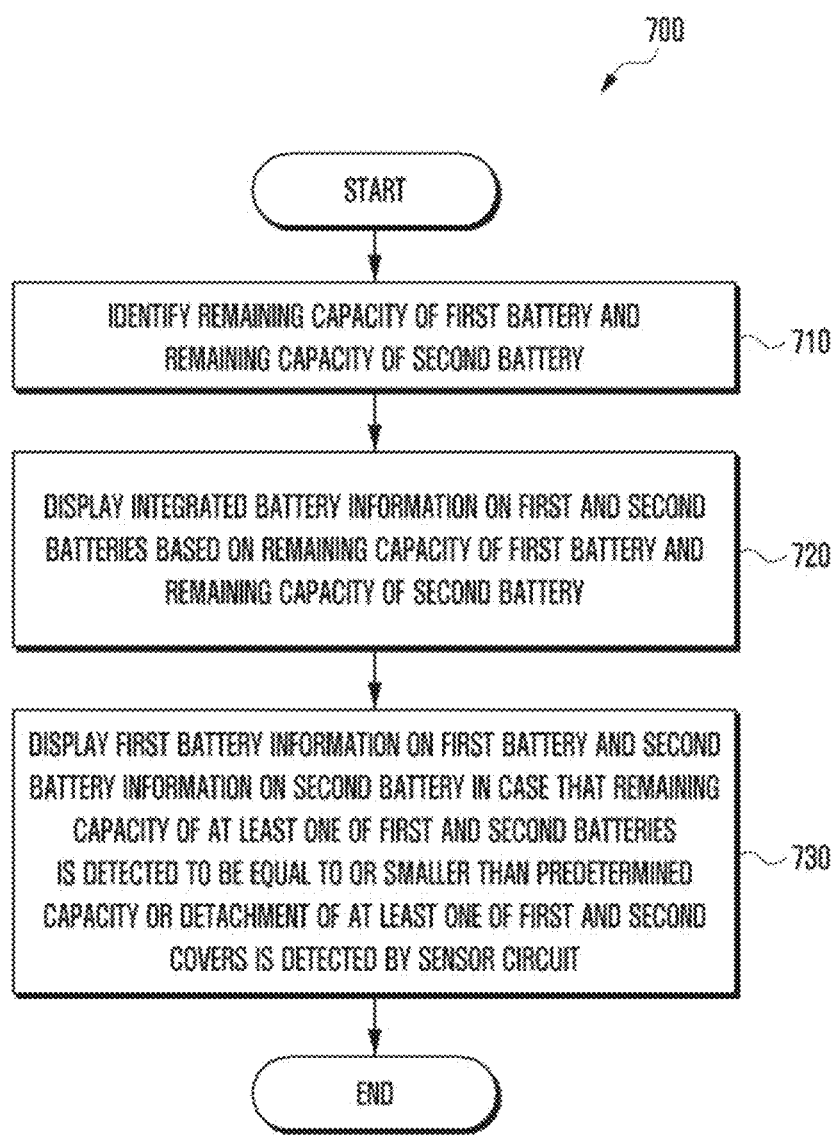

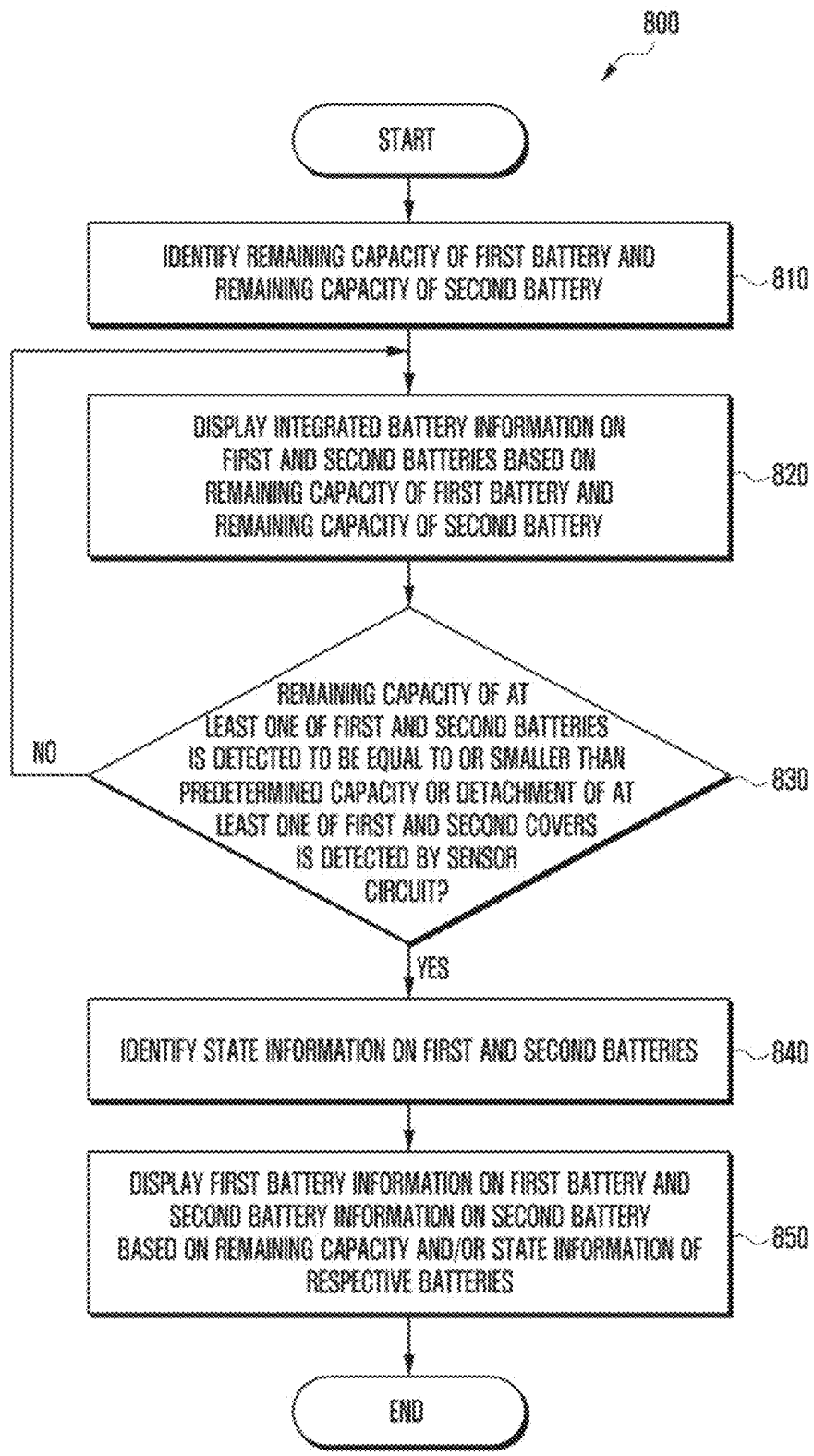

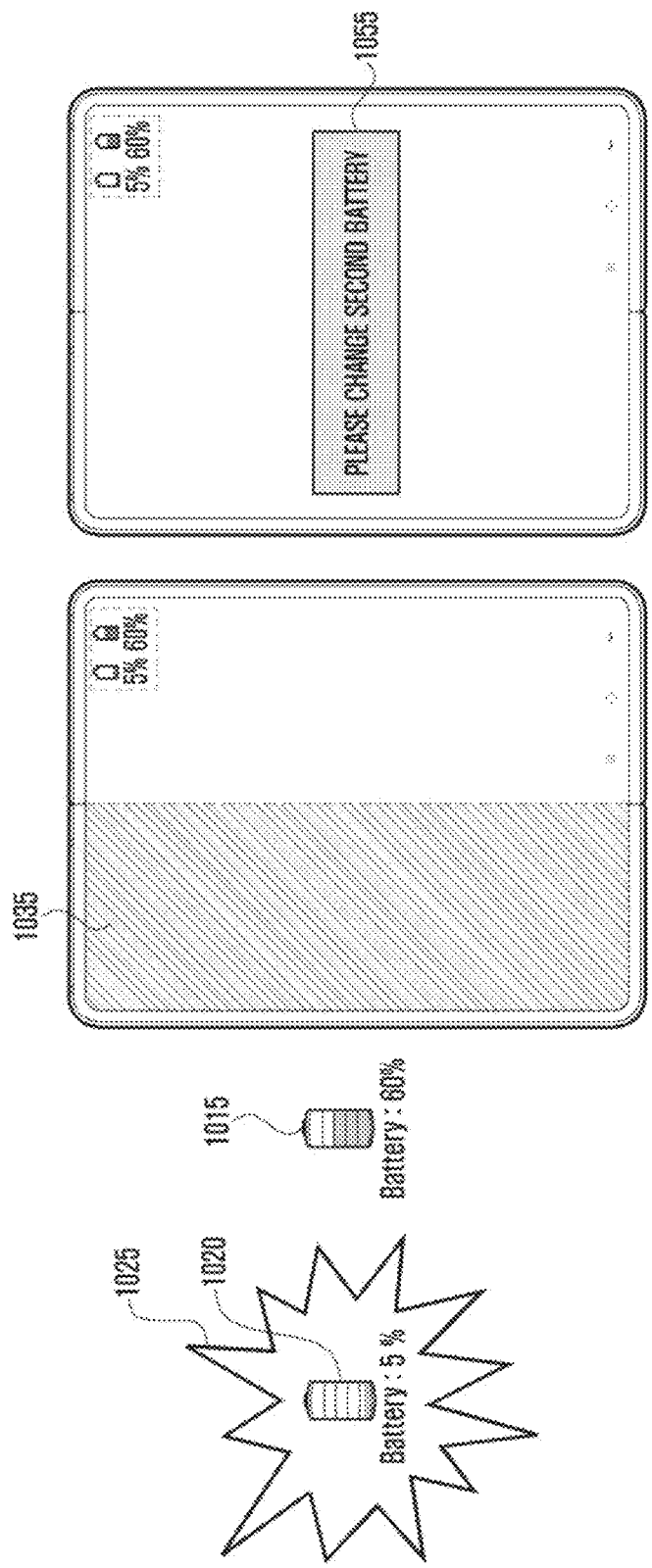

ELECTRONIC DEVICE AND METHOD OF DISPLAYING INFORMATION OF A PLURALITY OF BATTERIES USING THE SAME

CROSS-REFERENCE TO RELATED APPLICATION(S)

This application is a bypass continuation of PCT International Application No. PCT/KR2023/000351, which was filed on Jan. 9, 2023, and claims priority to Korean Patent Application No. 10-2022-0026980, filed on Mar. 2, 2022, and Korean Patent Application No. 10-2022-0047010, filed on Apr. 15, 2022, in the Korean Intellectual Property Office, the disclosures of which are incorporated herein by reference in their entireties.

BACKGROUND

1. Field

The present disclosure relates to an electronic device and a method of displaying information of a plurality of batteries using the same.

2. Description of Related Art

An electronic device may be a foldable electronic device and may include a foldable housing that may be folded or unfolded. For example, a foldable housing may include two housings disposed to be foldable with respect to a folding axis. The electronic device may include first and second batteries separably disposed in internal spaces of the two housings, respectively. The electronic device may provide integrated battery information based on a remaining capacity of the first battery and a remaining capacity of the second battery.

SUMMARY

Because the integrated battery information is provided based on the remaining capacity of the first battery and the remaining capacity of the second battery, a user cannot identify which one of the first and second batteries needs to be replaced in a situation in which the battery needs to be replaced.

In case that a remaining capacity of at least one of first and second batteries is detected to be equal to or smaller than a predetermined capacity or in case that detachment of at least one of first and second covers is detected, the present disclosure provides for an electronic device that may display first battery information on the remaining capacity of the first battery and second battery information on the remaining capacity of the second battery.

The electronic device may display the first battery information on the remaining capacity of the first battery and the second battery information on the remaining capacity of the second battery in consideration of not only the remaining capacities of the first and second batteries but also state information such as the number of times of detachment and/or the number of charging and discharging times.

According to an aspect of the disclosure, an electronic device includes: a hinge module; a first housing; a second housing connected to the hinge module, and configured to be foldable with respect to the first housing; a plurality of batteries includes at least a first battery detachably disposed in a first internal space of the first housing, and a second battery detachably disposed in a second internal space of the second housing; a first cover detachably disposed on a rear surface of the first housing; a second cover detachably disposed on a rear surface of the second housing; a sensor circuit configured to detect a detachment of at least one of the first cover and the second cover; a display; a memory storing instructions; and a processor operatively connected to the first battery, the second battery, the sensor circuit, the display, and the memory. The processor is configured to execute the instructions to: display, on the display, integrated battery information on the plurality of batteries, based on remaining capacity information on the plurality of batteries, wherein the remaining capacity information may include at least a remaining capacity on the first battery and a remaining capacity on the second battery, and display, on the display, first battery information on the first battery and second battery information on the second battery, based on detecting that at least one of the remaining capacity on the first battery and remaining capacity on the second battery is equal to or less than a predetermined capacity, or based on detecting the detachment of at least one of the first cover and the second cover.

According to an aspect of the disclosure, a method of displaying information on a plurality of batteries of an electronic device includes: displaying, via a display, integrated battery information (INTEGRATED BATTERY INFORMATION) on a plurality of batteries, based on remaining capacity information on the plurality of batteries, where the plurality of batteries comprise at least a first battery detachably disposed in a first internal space of a first housing of the electronic device, and a second battery detachably disposed in a second internal space of a second housing of the electronic device, and where the remaining capacity information may include at least a remaining capacity on the first battery and a remaining capacity on the second battery; and displaying, via the display, first battery information on the first battery and second battery information on the second battery, based on detecting that at least one of the remaining capacity on the first battery and remaining capacity on the second battery may be equal to or less than a predetermined capacity, or based on detecting a detachment of at least one of a first cover and a second cover, where the first cover may be disposed on a rear surface of the first housing, and the second cover may be disposed on a rear surface of the second housing.

According to an aspect of the disclosure, a non-transitory computer-readable storage medium storing a program that, when executed by a processor, causes the processor to: displaying, via a display, integrated battery information on the plurality of batteries, based on remaining capacity information on the plurality of batteries, where the plurality of batteries comprise at least a first battery detachably disposed in a first internal space of a first housing of the electronic device, and a second battery detachably disposed in a second internal space of a second housing of the electronic device, and where the remaining capacity information on the plurality of batteries comprises at least a remaining capacity on the first battery and a remaining capacity on the second battery; and displaying, via the display, first battery information on the first battery and second battery information on the second battery, based on detecting that at least one of the remaining capacity on the first battery and the remaining capacity on the second battery is equal to or less than a predetermined capacity, or based on detecting a detachment of at least one of a first cover and a second cover by a sensor circuit, wherein the first cover is disposed on a rear surface of the first housing, and the second cover is disposed on a rear surface of the second housing.

According to various embodiments, the present disclosure provides for an electronic device that displays the first battery information on the remaining capacity of the first battery and the second battery information on the remaining capacity of the second battery in case that the remaining capacity of at least one of the first and second batteries is equal to or smaller than the predetermined capacity or the detachment of at least one of the first and second covers disposed on the rear surface of the electronic device is detected. Therefore, the user may intuitively identify the battery, which needs to be replaced, based on the first battery information and the second battery information, in the situation in which the battery is required to be replaced.

According to various embodiments, the present disclosure provides for an electronic device that displays the first battery information and the second battery information in the situation in which the battery is required to be replaced. Therefore, it is possible to prevent a situation in which the electronic device is turned off while the electronic device is used or a situation in which a particular function (e.g., a camera function) cannot be used because the battery is equal to or smaller than the predetermined capacity.

According to various embodiments, the present disclosure provides for an electronic device that provides the guide about the battery to be replaced by displaying the first battery information on the remaining capacity of the first battery and the second battery information on the remaining capacity of the second battery by considering the state information (e.g., the number of times of detachment and/or the number of charging and discharging times (e.g., cycles)) as well as the remaining capacities of the first and second batteries. Therefore, it is possible to increase the lifespan of the battery.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 6 is a view illustrating a structure of a platform architecture of an electronic device, according to various embodiments;

FIG. 7 is a flowchart for explaining a method of displaying information on a plurality of batteries, according to various embodiments;

FIG. 8 is a flowchart for explaining a method of displaying information on the plurality of batteries, according to various embodiments;

FIG. 10A, FIG. 10B, and FIG. 10C are views for explaining a method of displaying information on the plurality of batteries, according to various embodiments.

DETAILED DESCRIPTION

Figure 1:
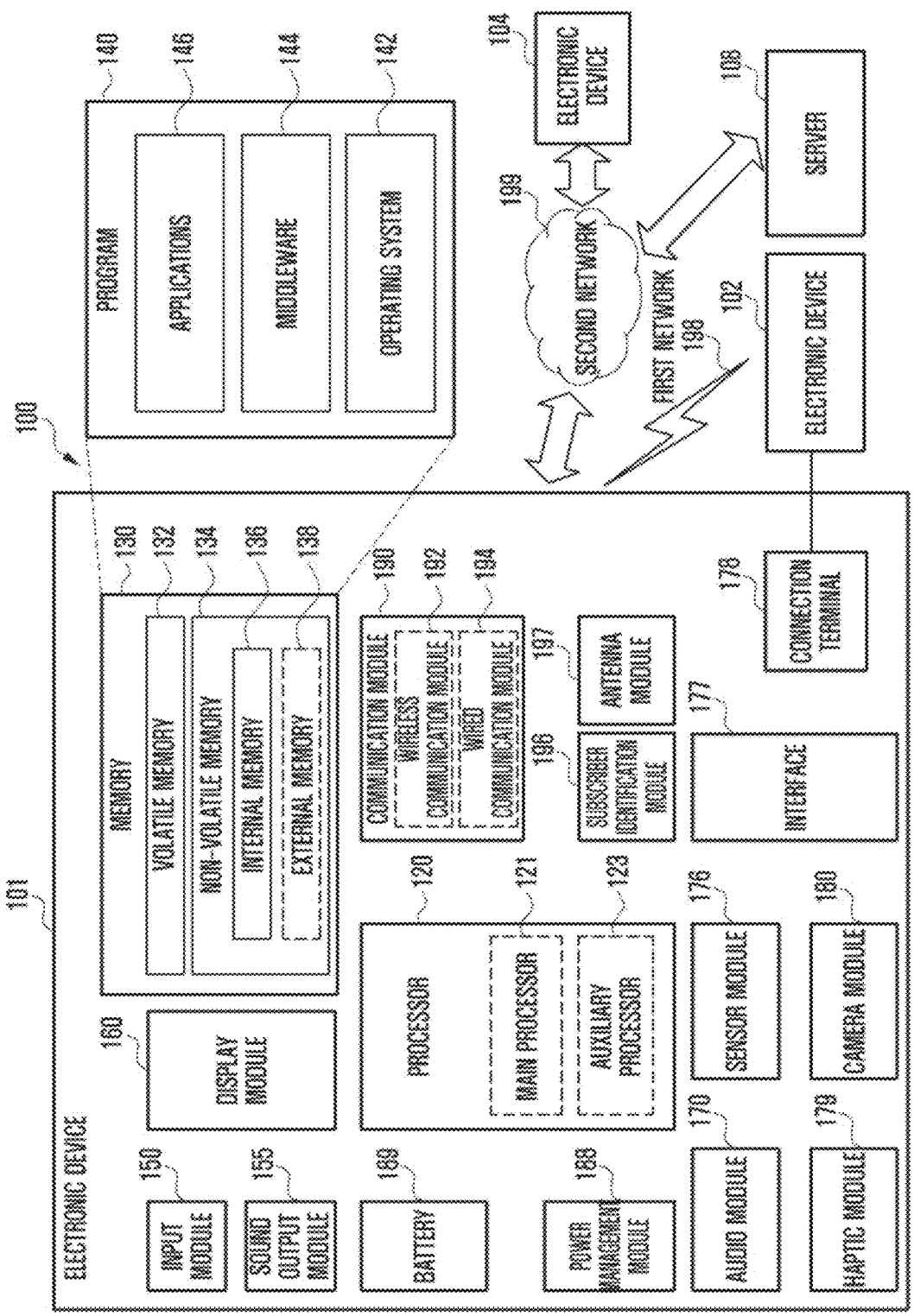
FIG. 1 is a block diagram of an electronic device in a network environment, according to various embodiments.

Embodiments and features as described and illustrated in the disclosure are merely examples, and there may be various modifications thereto.

Throughout the specification, like reference numerals refer to like parts or components. This specification does not describe all elements of the embodiments of the present disclosure and detailed descriptions on what are well known in the art or redundant descriptions on substantially the same configurations may be omitted.

Further, in the disclosure, the expressions "A or B," "at least one of A and/or B," or "one or more of A and/or B" and the like may include all possible combinations of the listed items. For example, "A or B," "at least one of A and B," or "at least one of A or B" may refer to all of the following cases: (1) including at least one A, (2) including at least one B, or (3) including at least one A and at least one B.

FIG. 1 is a block diagram illustrating an electronic device 101 in a network environment 100 according to various embodiments.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and/or an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) (e.g., speaker or headphone) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., through wires) or wirelessly. According to an embodiment, the interface 177 may include, for example, a high-definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the electronic device 102). According to an embodiment, the connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., an application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, Wi-Fi direct, or infrared data association (IrDA)) or the second network 199 (e.g., a long-range communication network, such as a legacy cellular network, a fifth generation (5G) network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large-scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., an mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., through wires), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
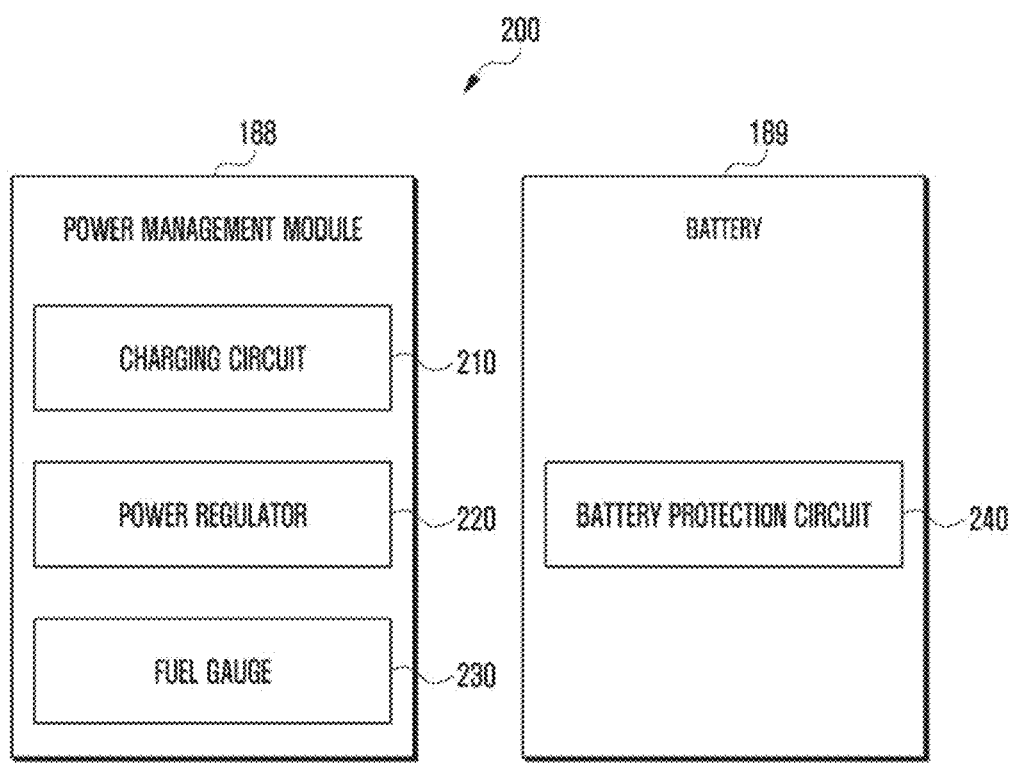
FIG. 2 is a block diagram illustrating a power management module and a battery, according to various embodiments.

FIG. 2 is a block diagram 200 illustrating the power management module 188 and the battery 189 according to various embodiments.

Referring to FIG. 2, the power management module 188 may include charging circuitry 210, a power adjuster 220, or a power gauge 230. The charging circuitry 210 may charge the battery 189 by using power supplied from an external power source outside the electronic device 101. According to an embodiment, the charging circuitry 210 may select a charging scheme (e.g., normal charging or quick charging) based at least in part on a type of the external power source (e.g., a power outlet, a USB, or wireless charging), magnitude of power suppliable from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to an embodiment, the power adjuster 220 may be implemented in the form of a low drop out (LDO) regulator or a switching regulator. The power gauge 230 may measure use state information about the battery 189

(e.g., a capacity, a number of times of charging or discharging, a voltage, or a temperature of the battery 189).

The power management module 188 may determine, using, for example, the charging circuitry 210, the power adjuster 220, or the power gauge 230, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a protection circuit module (PCM) 240. The PCM 240 may perform one or more of various functions (e.g., a pre-cutoff function) to prevent a performance deterioration of, or a damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 230, or the power management module 188. According to an embodiment, the corresponding sensor (e.g., a temperature sensor) of the sensor module 176 may be included as part of the PCM 240, or may be disposed near the battery 189 as a separate device.

Figure 3A:
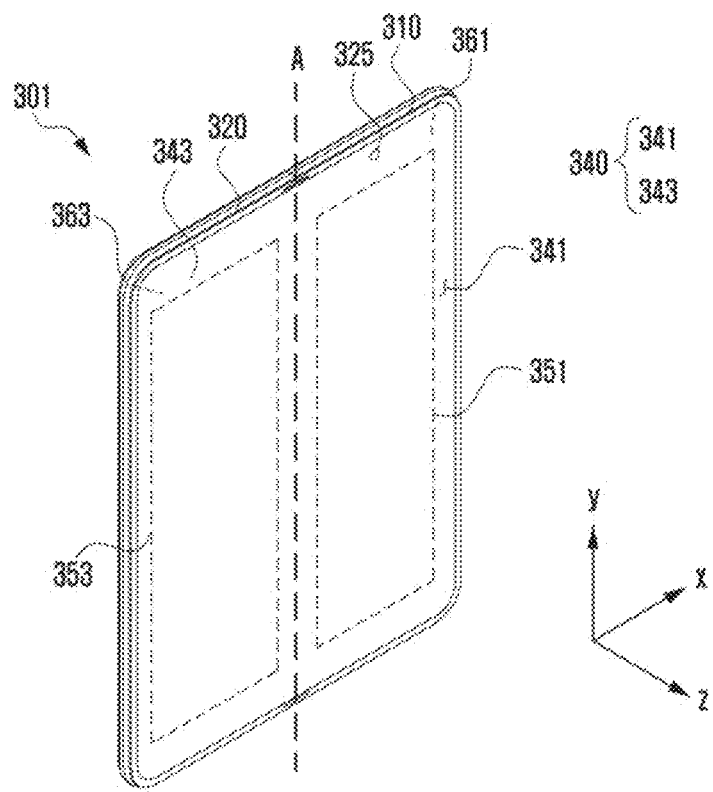
FIG. 3A and FIG. 3B are views illustrating an electronic device, according to various embodiments.
Figure 3B:
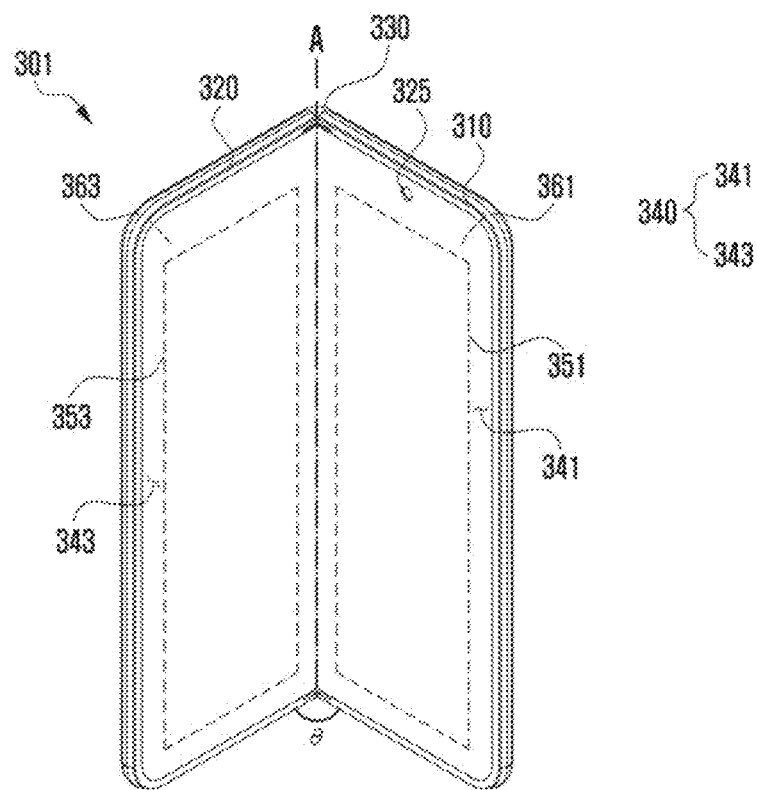

FIG. 3A and FIG. 3B are views illustrating an electronic device 301, according to various embodiments.

The electronic device 301 that may be folded with respect to a folding axis A in a vertical direction (e.g., a y-axis direction).

Referring to FIGS. 3A and 3B, the electronic device 301 (e.g., the electronic device 101 in FIG. 1) may include: a first housing 310 and a second housing 320 (e.g., foldable housings) coupled to each other so as to be rotatable about a folding axis A by means of a hinge module 330 so that the first housing 310 and the second housing 320 are folded with respect to each other; and/or a display 340 (e.g., the display module 160 in FIG. 1, a flexible display, or a foldable display) disposed through the first housing 310 and the second housing 320.

According to various embodiments, the first housing 310 and the second housing 320 may be disposed to be foldable with respect to each other by means of the hinge module 330. According to various embodiments, the first housing 310 and the second housing 320 is not limited by the shapes and coupling illustrated in FIGS. 3A and 3B and may be implemented by combination and/or coupling of other shapes or components. According to various embodiments, the first housing 310 and second housing 320 may be disposed at two opposite sides based on the folding axis A and have a symmetric shape, as a whole, with respect to the folding axis A. According to various embodiments, the first housing 310 and second housing 320 may be asymmetrically folded with respect to the folding axis A. According to various embodiments, an angle or distance defined between the first housing 310 and second housing 320 may vary depending on whether the electronic device 301 is in an unfolded state (e.g., a flat, or open state) as shown in FIG. 3A, a folded state (e.g., a closed state), or an intermediate state as shown in FIG. 3B.

According to various embodiments, based on the folding axis A, the display 340 may be divided into a first area 341 disposed on a front surface of the first housing 310, and a second area 343 disposed on a front surface of the second housing 320. In this case, a surface of the electronic device 301 on which the display 340 is disposed may be defined as a front surface (e.g., a first surface, a surface disposed in a +z-axis direction) of the electronic device 301, and a surface opposite to the front surface may be defined as a rear surface (e.g., a second surface or a back surface, a surface disposed in a −z-axis direction) of the electronic device 301. In addition, a surface, which at least partially surrounds a space between the front and rear surfaces, may be defined as a side surface of the electronic device 301.

According to various embodiments, in case that the electronic device 301 is in the unfolded state, as shown in FIG. 3A, the first housing 310 and second housing 320 may define an angle of about 180 degrees therebetween, and the first area 341 and second area 343 of the display 340 may be disposed on the same plane and disposed in substantially the same direction (e.g., a +z-axis direction).

According to various embodiments, the hinge module 330 may be implemented in an in-folding way in which the first area 341 and second area 343 of the display 340 face each other with respect to the front surface when the electronic device 301 switches (changes) from the unfolded state to the folded state. For example, in case that the electronic device switches (changes) from the unfolded state to the folded state, the first area 341 and second area 343 of the display 340 may be disposed to face each other with respect to the front surface. According to various embodiments, when the electronic device 301 switches (changes) from the unfolded state to the folded state, an out-folding way may be implemented, in which the first housing 310 rotates by an angle of about 360 degrees with respect to the second housing 320, and the first area 341 and second area 343 of the display 340 face in opposite directions.

According to various embodiments, in case that the electronic device 301 is in the intermediate state, as shown in FIG. 3B, the first housing 310 and second housing 320 may be disposed at a predetermined angle (e.g., θ). In this case, the first area 341 and second area 343 of the display 340 may define an angle larger than an angle in the folded state and smaller than an angle in the unfolded state. In various embodiments, the first housing 310 and second housing 320 may define an angle by means of the hinge module 330 so that the first housing 310 and second housing 320 may be stopped at a predetermined folding angle between the folded state and the unfolded state (free stop function). In various embodiments, the first housing 310 and second housing 320 may operate while being pressed in an unfolding direction or a folding direction by means of the hinge module 330 based on a predetermined inflection angle.

According to various embodiments, the electronic device 301 may include a plurality of batteries, e.g., a first battery 351 and a second battery 353. For example, the first battery 351 may be detachably disposed in an internal space of the first housing 310. The second battery 353 may be detachably disposed in an internal space of the second housing 320.

According to various embodiments, the first battery 351 and second battery 353 may each be disposed as a battery pack or as a plurality of batteries cells in a single battery pack.

According to various embodiments, the first battery 351 and second battery 353 may be identical or different in at least one of the types or capacities (or maximum capacities).

According to various embodiments, the electronic device 301 may include: a first rear surface cover 361 disposed on the rear surface (e.g., the surface disposed in the −z-axis direction) of the first housing 310; and a second rear surface cover 363 disposed on the rear surface (e.g., the surface disposed in the −z-axis direction) of the second housing 320. According to various embodiments, at least one of the first rear surface cover 361 and second rear surface cover 363 may each be provided in the form of a substantially transparent plate (e.g., a glass or polymer plate including various coating layers) or an opaque plate.

According to various embodiments, a camera module 325 may be disposed on one surface (e.g., a partial area of the front surface) of the first housing 310, however the present disclosure is not limited thereto. According to various embodiments, the camera module 325 or an additional camera module may be disposed on the rear surface of the first housing 310 and/or the rear surface of the second housing 320. According to various embodiments, the camera module 325 and/or one or more additional camera modules may include one or more lenses, an image sensor, and/or an image signal processor. In various embodiments, at least one of the camera module 325 and/or one or more additional camera modules may include two or more lenses (e.g., a wide-angle lens and a telephoto lens) and image sensors and be disposed together on any one surface of the first housing 310 and/or the second housing 320.

According to various embodiments, the electronic device 301 may include at least one of an input device (e.g., the input module 150 in FIG. 1) disposed on the first housing 310 and/or the second housing 320, a sound output device (e.g., the sound output module 155 in FIG. 1), a sensor module (e.g., the sensor module 176 in FIG. 1), a key input device, an indicator, and a connector port (e.g., the connection terminal 178 in FIG. 1). In various embodiments, the electronic device 301 may exclude at least one of the constituent elements or further include at least one of other constituent elements.

Figure 4A:
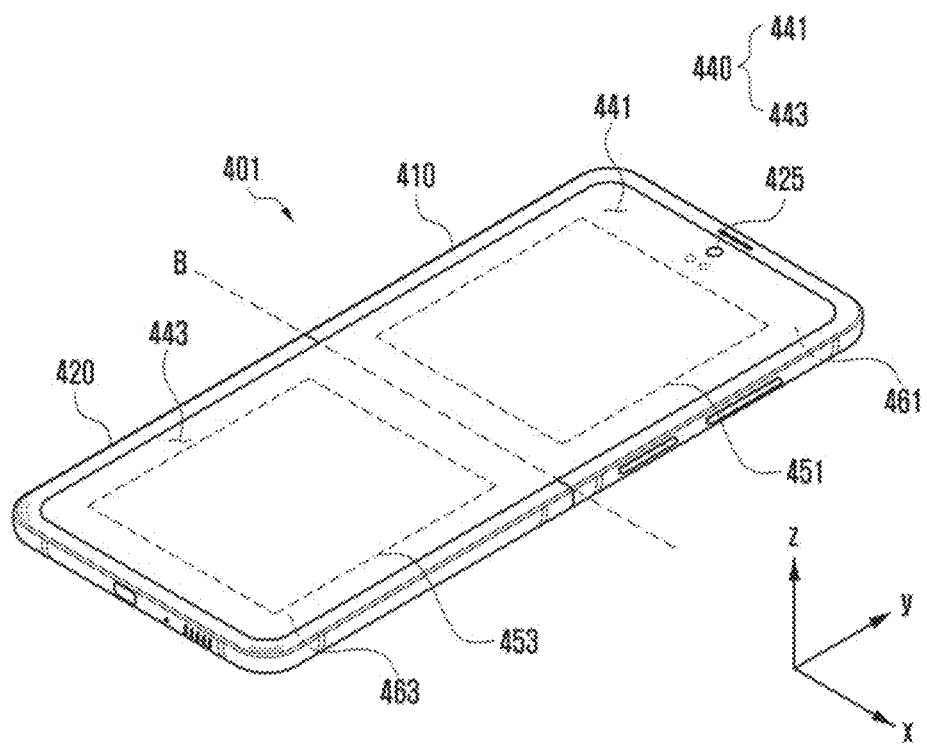
FIG. 4A and FIG. 4B are views illustrating an electronic device, according to various embodiments.
Figure 4B:
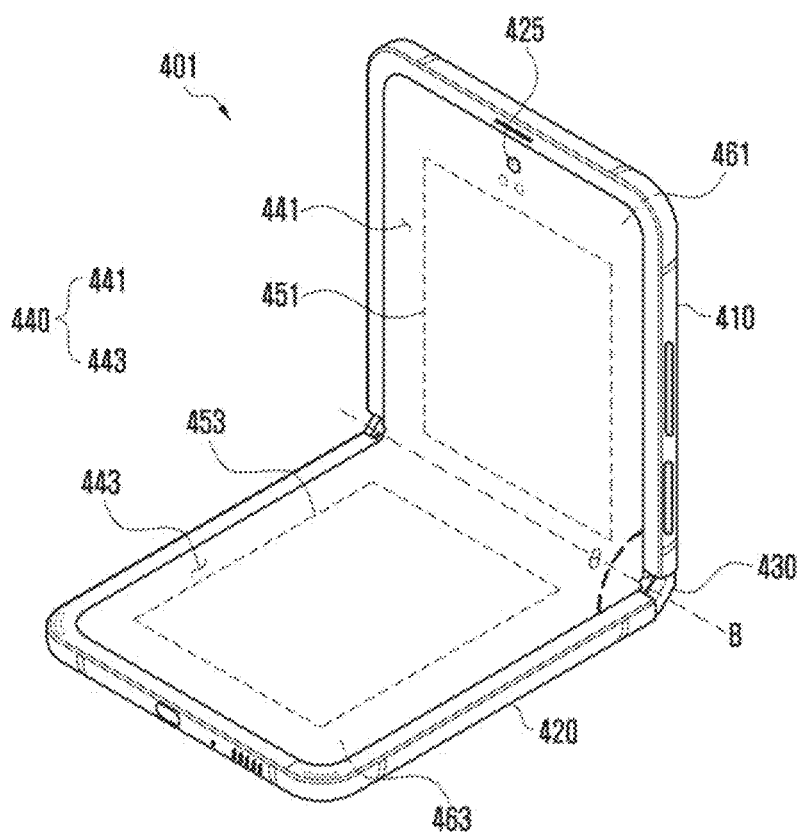

FIG. 4A and FIG. 4B are views illustrating an electronic device 401, according to various embodiments.

The electronic device 401 that may be folded with respect to a folding axis B in a horizontal direction (e.g., an x-axis direction).

With respect to FIGS. 3A and 3B, the electronic device 401 illustrated in FIGS. 4A and 4B is implemented to be foldable with respect to the folding axis B in the horizontal direction (e.g., the x-axis direction) instead of the folding axis A in the vertical direction (e.g., the y-axis direction). The remaining components in FIGS. 4A and 4B are identical to the components illustrated in FIGS. 3A and 3B, and detailed repeated descriptions of constitutions, functions, and/or structures illustrated in FIGS. 4A and 4B may be replaced with the descriptions described with reference to FIGS. 3A and 3B.

Referring to FIGS. 4A and 4B, the electronic device 401 (e.g., the electronic device 101 in FIG. 1) may include: a first housing 410 and a second housing 420 (e.g., foldable housings) coupled to each other so as to be rotatable about the folding axis B by means of a hinge module 430 and foldable with respect to each other; and/or a display 440 (e.g., the display module 160 in FIG. 1, a flexible display or a foldable display) disposed through the first housing 410 and the second housing 420.

According to various embodiments, the first housing 410 and second housing 420 of the electronic device 401 may be disposed at upper and lower sides based on the folding axis B and have a substantially symmetric shape with respect to the folding axis B.

According to various embodiments, the display 440 may include: a first area 441 disposed on a front surface of the first housing 410 based on the folding axis B, and a second area 443 disposed on a front surface of the second housing 420.

According to various embodiments, in case that the electronic device 401 is in the unfolded state, as shown in FIG. 4A, the first housing 410 and second housing 420 may define an angle of about 180 degrees therebetween, and the first area 441 and second area 443 of the display 440 may be disposed on the same plane and disposed in substantially the same direction (e.g., the +z-axis direction).

According to various embodiments, the hinge module 430 may be implemented in an in-folding way in which the first area 441 and second area 443 of the display 440 face each other with respect to the front surface when the electronic device 401 switches (changes) from the unfolded state to the folded state, however the present disclosure is not limited thereto. According to various embodiments, when the electronic device 401 switches (changes) from the unfolded state to the folded state, an out-folding way may be implemented, in which the first housing 410 rotates by an angle of about 360 degrees with respect to the second housing 420, and the first area 441 and second area 443 of the display 440 face in opposite directions.

According to various embodiments, the electronic device 401 may include a plurality of batteries, e.g., a first battery 451 and a second battery 453. For example, the first battery 451 may be detachably disposed in an internal space of the first housing 410. The second battery 453 may be detachably disposed in an internal space of the second housing 420. The first battery 451 and second battery 453 may each be disposed as a battery pack or as a plurality of batteries cells in a single battery pack.

According to various embodiments, the first battery 451 and second battery 453 may be identical or different in at least one of the types or capacities (or maximum capacities).

According to various embodiments, the electronic device 401 may include: a first rear surface cover 461 disposed on the rear surface (e.g., the surface disposed in the −z-axis direction) of the first housing 410; and a second rear surface cover 463 disposed on the rear surface (e.g., the surface disposed in the −z-axis direction) of the second housing 420. According to various embodiments, at least one of the first rear surface cover 461 and second rear surface cover 463 may each be provided in the form of a substantially transparent plate (e.g., a glass or polymer plate including various coating layers) or an opaque plate.

Figure 5:
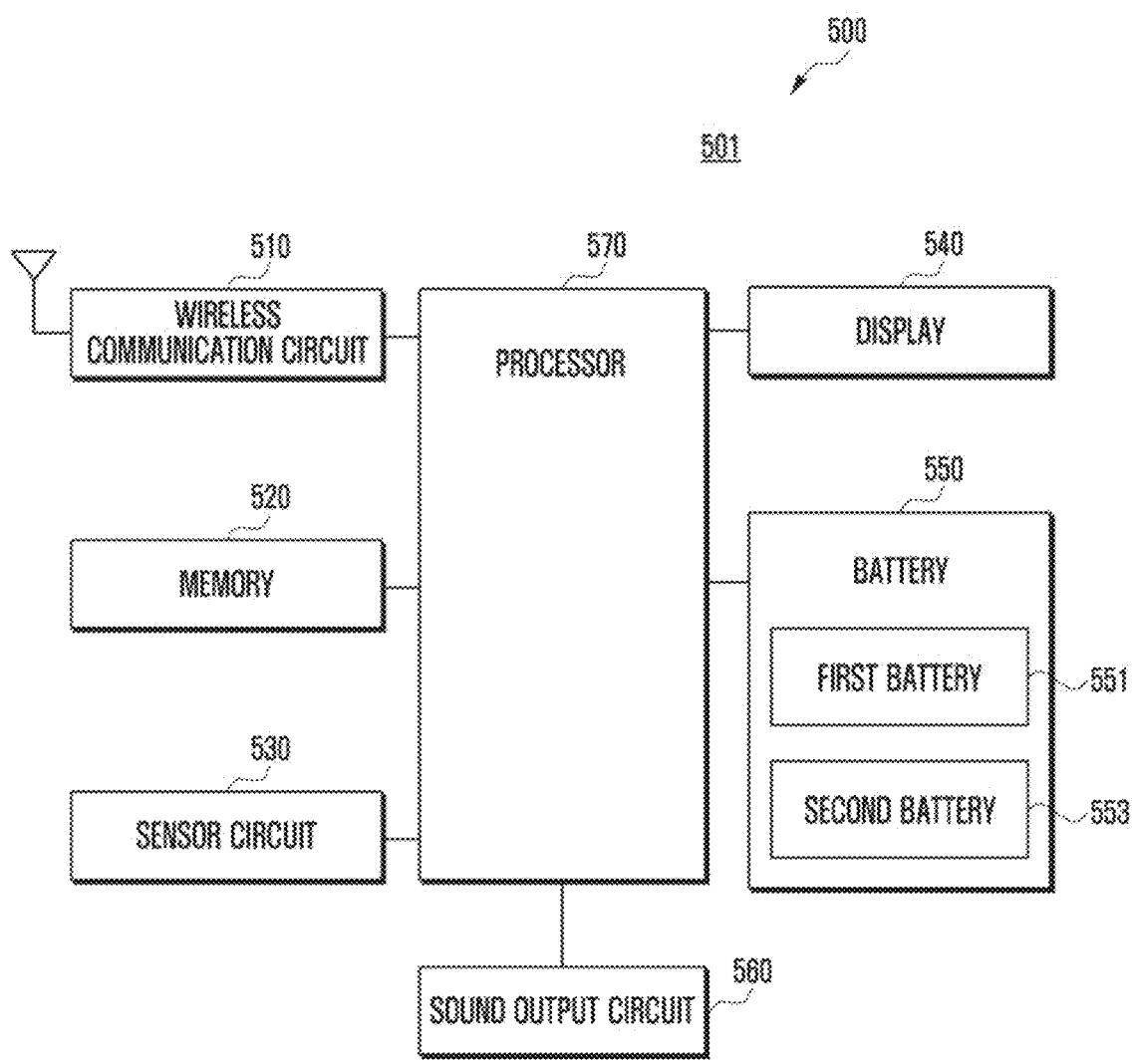
FIG. 5 is a block diagram illustrating an electronic device, according to various embodiments.

FIG. 5 is a block diagram 500 illustrating an electronic device 501, according to various embodiments.

Referring to FIG. 5, the electronic device 501 (e.g., the electronic device 101 in FIG. 1, the electronic device 301 in FIGS. 3A and 3B, the electronic device 401 in FIGS. 4A and 4B) may include a wireless communication circuit 510 (e.g., the communication module 190 in FIG. 1), a memory 520 (e.g., the memory 130 in FIG. 1), a sensor circuit 530 (e.g., the sensor module 176 in FIG. 1), a display 540 (e.g., the display module 160 in FIG. 1, the display 340 in FIGS. 3A and 3B, or the display 440 in FIGS. 4A and 4B), a battery 550 (e.g., the battery 189 in FIG. 1), a sound output circuit 560 (e.g., the sound output module 155 in FIG. 1), and/or a processor 570 (e.g., the processor 120 in FIG. 1).

According to various embodiments, the wireless communication circuit 510 (e.g., the communication module 190 in FIG. 1) may include a near-field wireless communication circuit. The near-field wireless communication circuit may include Bluetooth, BLE (Bluetooth low energy), WiFi (wireless fidelity) direct, UWB (ultra-wideband), and/or IrDA (infrared data association).

According to various embodiments, the wireless communication circuit 510 may connect communication between the electronic device 501 and an external electronic device (e.g., a wearable device (e.g., a wireless audio device or a smart watch)) under the control of the processor 570. In case that the communication with the external electronic device is connected, the wireless communication circuit 510 may transmit notification information related to the replacement of the battery 550 (e.g., the first battery 551 and/or the second battery 553) to the external electronic device in order to output the notification informing of the replacement of the battery 550 (e.g., the first battery 551 and/or the second battery 553) from the external electronic device under the control of the processor 570.

According to various embodiments, the memory 520 (e.g., the memory 130 in FIG. 1) may serve to store a program for processing and controlling the processor 570 of the electronic device 501, an operating system (OS), various applications, and/or input/output data and store a program for controlling an overall operation of the electronic device 501. The memory 520 may store various configuration information required for the electronic device 501 to process the function related to various embodiments of the present disclosure.

According to various embodiments, the memory 520 may store one or more instructions for indicating integrated battery information on the first battery 551 and second battery 553 or battery information on the first battery 551 and second battery 553 based on information on the remaining capacity of the battery 550 (e.g., the first battery 551 and second battery 553) and state information (e.g., the number of times of detachment and/or the number of charging and discharging times) related to the battery 550 (e.g., the first battery 551 and second battery 553). The memory 520 may store sensor values for detecting the detachment of the first cover (e.g., the first rear surface cover 361 in FIGS. 3A and 3B, the first rear surface cover 461 in FIGS. 4A and 4B) and the second cover (e.g., the second rear surface cover 363 in FIGS. 3A and 3B, the second rear surface cover 463 in FIGS. 4A and 4B) of the electronic device 501.

According to various embodiments, the memory 520 may map and store the number of times of detachment of the first battery 551 and second battery 553 (battery detachment count of the first battery 551 and battery detachment count of the second battery 553) and identification information on the batteries (first battery 551 and second battery 553).

According to various embodiments, the memory 520 may map and store the battery charge/discharge count of the first battery 551 and second battery 553 and the identification information on the batteries (first battery 551 and second battery 553).

According to various embodiments, the sensor circuit 530 (e.g., the sensor module 176 in FIG. 1) may measure physical quantities or detect an operating state of the electronic device 501, and the sensor circuit 530 may create electrical signals or data values corresponding to the physical quantities or the operating state of the electronic device 501.

According to various embodiments, the sensor circuit 530 may include at least one grip sensor. The at least one grip sensor may acquire a sensor signal related to a gripped state of the electronic device 501 and/or sensor signals related to detached states of the first rear surface cover 361 and first rear surface cover 461 and/or the second rear surface cover 363 and second rear surface cover 463, and the grip sensor may transmit the acquired sensor signals to the processor 570.

According to various embodiments, the display 540 (e.g., the display module 160 in FIG. 1, the display 340 in FIGS. 3A and 3B, or the display 440 in FIGS. 4A and 4B) may display images under the control of the processor 570 and be implemented as any one of a liquid crystal display (LCD), a light-emitting diode (LED) display, an organic light-emitting diode (OLED) display, a microelectromechanical system (MEMS) display, an electronic paper display, and a flexible display. However, the present disclosure is not limited thereto.

According to various embodiments, the display 540 may display integrated battery information on the first battery 551 and second battery 553 based on a remaining capacity of the first battery 551 and a remaining capacity of the second battery 553 under the control of the processor 570. In case that the remaining capacity of at least one of the first battery 551 and second battery 553 is detected to be equal to or smaller than a predetermined capacity, a discharged state of at least one of the first battery 551 and second battery 553 is detected, or detachment of at least one of the first and second covers (first rear surface cover 361, first rear surface cover 461, second rear surface cover 363, and second rear surface cover 463) is detected by the sensor circuit 530, the display 540 may display first battery information on the first battery 551 and second battery information on the second battery 553 under the control of the processor 570. In case that the remaining capacity of at least one of the first battery 551 and second battery 553 is detected to be equal to or smaller than the predetermined capacity, the discharged state of at least one of the first battery 551 and second battery 553 is detected, or the detachment of at least one of the first and second covers (first rear surface cover 361, first rear surface cover 461, second rear surface cover 363, and second rear surface cover 463) is detected by the sensor circuit 530, the display 540 may display only the battery information on the battery, which is required to be replaced between the first battery 551 and second battery 553, under the control of the processor 570. The display 540 may display a notification message indicating the replacement of batteries (first battery 551 and second battery 553) under the control of the processor 570.

According to various embodiments, under the control of the processor 570, the display 540 may display, through a user interface, various information related to the charging of the battery 550.

According to various embodiments, the battery 550 (e.g., the battery 189 in FIG. 1) may include a first battery 551 (e.g., the first battery 351 in FIGS. 3A and 3B or the first battery 451 in FIGS. 4A and 4B) and a second battery 553 (e.g., the second battery 353 in FIGS. 3A and 3B or the second battery 453 in FIGS. 4A and 4B). The first battery 551 may be detachably disposed in an internal space of the first housing (e.g., the first housing 310 in FIGS. 3A and 3B or the first housing 410 in FIGS. 4A and 4B) of the electronic device 501. The second battery 553 may be detachably disposed in an internal space of the second housing (e.g., the second housing 320 in FIGS. 3A and 3B or the second housing 420 in FIGS. 4A and 4B) of the electronic device 501. For example, the battery 550 may include a lithium-ion battery, a rechargeable battery, and/or a solar cell.

According to various embodiments, the sound output circuit 560 (e.g., the sound output module 155 in FIG. 1) may output, through sound, a notification informing of the replacement of the batteries (first battery 551 and second battery 553) or contents based on text (e.g., a notification message indicating the replacement of the battery) displayed through the user interface.

According to various embodiments, the processor 570 may include a microcontroller unit (MCU) and control a plurality of hardware elements connected to the processor 570 by operating an operating system (OS) or an embedded software program. For example, the processor 570 may control the plurality of hardware elements based on instructions stored in the memory 520.

According to various embodiments, the processor 570 may identify the remaining capacity of the first battery 551 and the remaining capacity of the second battery 553. The processor 570 may acquire and identify remaining capacity information including the remaining capacity of the first battery 551 and the remaining capacity of the second battery 553 from a fuel gauge (e.g., the power gauge 230 in FIG. 2 or a battery protection circuit (e.g., the PCM 240 in FIG. 2)). The processor 570 may display the integrated battery information on the first battery 551 and second battery 553 based on the remaining capacity of the first battery 551 and the remaining capacity of the second battery 553. For example, the processor 570 may calculate an overall remaining capacity of the first battery 551 and second battery 553 based on the remaining capacity of the first battery 551 and the remaining capacity of the second battery 553 and display the integrated battery information including the calculated overall remaining capacity of the first battery 551 and second battery 553 on the display 540.

According to various embodiments, in case that the remaining capacity of at least one of the first battery 551 and second battery 553 is detected to be equal to or smaller than the predetermined capacity, the discharged state of at least one of the first battery 551 and second battery 553 is detected, or the detachment of at least one of the first and second covers (first rear surface cover 361, first rear surface cover 461, second rear surface cover 363, and second rear surface cover 463) is detected by the sensor circuit 530, the processor 570 may display the first battery information on the first battery 551 and the second battery information on the second battery 553. For example, the processor 570 may display the first battery information on the first battery 551 based on the remaining capacity of the first battery 551 and display the second battery information on the second battery 553 based on the remaining capacity of the second battery 553.

According to various embodiments, in case that the remaining capacity of at least one of the first battery 551 and second battery 553 is detected to be equal to or smaller than the predetermined capacity, the discharged state of at least one of the first battery 551 and second battery 553 is detected, or the detachment of at least one of the first and second covers (first rear surface cover 361, first rear surface cover 461, second rear surface cover 363, and second rear surface cover 463) is detected by the sensor circuit 530, the processor 570 may display only the battery information on the battery required to be replaced between the first battery 551 and second battery 553.

According to various embodiments, the processor 570 may configure different display attributes (e.g., colors, effects, and/or sizes) and display the first battery information on the first battery 551 and the second battery information on the second battery 553. For example, the processor 570 may differently configure and display the display attribute (e.g., the color, effect, and/or size) indicating battery information on the battery having the remaining capacity equal to or smaller than the predetermined capacity, and the display attribute (e.g., the color, effect, and/or size) indicating battery information on the battery having the remaining capacity larger than the predetermined capacity. As another example, in case that the remaining capacity of the first battery 551 and the remaining capacity of the second battery 553 are larger than the predetermined capacity, the processor 570 may compare the remaining capacity of the first battery 551 and the remaining capacity of the second battery 553 and configure and display the display attribute indicating the battery information on the battery having a smaller remaining capacity between the first battery 551 and second battery 553 differently from the display attribute indicating the battery information on the other battery.

According to various embodiments, the processor 570 may display the first battery information on the first battery 551 and the second battery information on the second battery 553 based on the state information (e.g., the battery detachment count and/or the battery charge/discharge count) on the respective batteries as well as the remaining capacity of the first battery 551 and the remaining capacity of the second battery 553.

The electronic device 501 according to various embodiments may include: the hinge module (e.g., the hinge module 330 in FIGS. 3A and 3B or the hinge module 430 in FIGS. 4A and 4B); the first housing (first housing 310 or first housing 410); the second housing (second housing 320 or second housing 420) connected to the hinge module 330 or 430 so as to be foldable with respect to the first housing (first housing 310 or first housing 410); the first battery 351, 451, or 551 detachably disposed in a first internal space of the first housing (first housing 310 or first housing 410); the second battery 353, 453, or 553 detachably disposed in a second internal space of the second housing (second housing 320 or second housing 420); the first rear surface cover (first rear surface cover 361 or first rear surface cover 461) disposed on the rear surface of the first housing (first housing 310 or first housing 410); the second cover (second rear surface cover 363 or second rear surface cover 463) disposed on the rear surface of the second housing (second housing 320 or second housing 420); the sensor circuit 530; the display 540; a memory 520 storing instructions; and the processor 570 operatively connected to the first battery 351, 451, or 551, the second battery 353, 453, or 553, the sensor circuit 530, the display 540, and the memory 520. The processor 570 may display, on the display 540, the integrated battery information on the plurality of batteries, based on remaining capacity information on the plurality of batteries. The remaining capacity information comprises at least a remaining capacity on the first battery 351, 451, or 551 and a remaining capacity on the second battery 353, 453, or 553. The processor 570 may be configured to display the first battery information on the first battery 351, 451, or 551 and the second battery information on the second battery 353, 453, or 553 on the display 540, based on detecting that at least one of the remaining capacity on the first battery 351, 451, or 551 and the remaining capacity on the second battery 353, 453, or 553 is equal to or less than a the predetermined capacity, or based on a detachment of at least one of the first cover (first rear surface cover 361 or first rear surface cover 461) and the second cover (second rear surface cover 363 or second rear surface cover 463) by the sensor circuit 530.

According to various embodiments, the processor 570 may be configured to display the first battery information based on the remaining capacity of the first battery 351, 451, or 551, and display the second battery information on the display 540 based on the remaining capacity of the second battery 353, 453, or 553.

According to various embodiments, the processor 570 may be configured to configure a display attributes for each of the first battery 351, 451, or 551 and the second battery 353, 453, or 553 to be different from each other, and display the first battery information on the first battery 351, 451, or 551 and the second battery information on the second battery 353, 453, or 553 based on the differently configured display attributes.

According to various embodiments, the display attribute may include at least one of a color, a visual effect, and a display size.

According to various embodiments, the processor 570 may compare the remaining capacity on the first battery 351, 451, or 551 and the remaining capacity on the second battery 353, 453, or 553 based on detecting that the remaining capacity on the first battery 351, 451, or 551 and the remaining capacity on the second battery 353, 453, or 553 are greater than the predetermined capacity, configure the display attribute for each of the first battery 351, 451, or 551 and the second battery 353, 453, or 553 to be different from each other based on a result of the comparing, and display, on the display (540), battery information on a battery having a smaller remaining capacity among the first battery 351, 451, or 551 and the second battery 353, 453, or 553 and battery information on the other battery differently, based on the differently configured display attributes.

According to various embodiments, the processor 570 may be configured to identify battery state information of the plurality of batteries based on detecting that at least one of the remaining capacity on the first battery 351, 451, or 551 and the remaining capacity on the second battery 353, 453, or 553 is equal to or less than the predetermined capacity, or based on detecting the detachment of at least one of the first cover (e.g., the first rear surface cover 361 in FIGS. 3A and 3B or the first rear surface cover 461 in FIGS. 4A and 4B) and the second cover (e.g., the second rear surface cover 363 in FIGS. 3A and 3B or the second rear surface cover 463 in FIGS. 4A and 4B). The battery state information comprises at least state information on the first battery 351, 451, or 551 and state information on the second battery. The processor 570 may be configured to display, on the display 540, the first battery information on the first battery 351, 451, or 551 and the second battery information on the second battery 353, 453, or 553 based on at least one of the remaining capacity information and the battery state information.

According to various embodiments, the battery state information may include the battery detachment count and/or the battery charge/discharge count.

According to various embodiments, the processor 570 may be configured to increment at least one of a battery detachment count of the first battery 351, 451, or 551 and a battery detachment count of the second battery 353, 453, or 553 based on detecting a detachment of at least one of the first battery 351, 451, or 551 and second battery 353, 453, or 553, map identification information of the first battery 351, 451, or 551 and the battery detachment count of the first battery 351, 451, or 551 based on detecting the detachment of the first battery 351, 451, or 551, and store the mapping of the identification information of the first battery 351, 451, or 551 and battery detachment count of the first battery 351, 451, or 551 in the memory 520, and map identification information of the second battery 353, 453, or 553 and the battery detachment count of the second battery 353, 453, or 553 based on detecting the detachment of the second battery 353, 453, or 553, and store the mapping of the identification information of the second battery 353, 453, or 553 and the battery detachment count of the second battery 353, 453, or 553 in the memory 520.

According to various embodiments, the processor 570 may be configured to identify a battery charge/discharge count of the first battery 351, 451, or 551 and a battery charge/discharge count of the second battery 353, 453, or 553, map the identification information of the first battery 351, 451, or 551 and the battery charge/discharge count of the first battery 351, 451, or 551, and store the mapping of the identification information of the first battery 351, 451, or 551 and the battery charge/discharge count of the first battery 351, 451, or 551 in the memory 520, and map the identification information of the second battery 353, 453, or 553 and the battery charge/discharge count of the second battery 353, 453, or 553, and store the mapping of the identification information of the second battery 353, 453, or 553 and the battery charge/discharge count of the second battery 353, 453, or 553 in the memory 520.

According to various embodiments, the processor 570 may be configured to identify whether each of the battery detachment count of the first battery 351, 451, or 551 and the battery detachment count of the second battery 353, 453, or 553 is greater than a predetermined number of times of detachment, or whether each of the battery charge/discharge count of the first battery 351, 451, or 551 and the battery charge/discharge count of the second battery 353, 453, or 553 is greater than a predetermined number of charge/discharge times, configure a display attribute of the first battery 351, 451, or 551 to a first display attribute based on at least one of the battery detachment count of the first battery 351, 451, or 551 being greater than the predetermined number of times of detachment and the battery charge/discharge count of the first battery 351, 451, or 551 being greater than the predetermined number of charge/discharge times, and configure the display attribute of the first battery 351, 451, or 551 to a second display attribute based on the battery detachment count of the first battery 351, 451, or 551 being equal to or less than the predetermined number of times of detachment and the battery charge/discharge count of the first battery 351, 451, or 551 being equal to less than the predetermined number of charge/discharge times, and configure a display attribute of the second battery 353, 453, or 553 to the first display attribute based on at least one of the battery detachment count of the second battery 353, 453, or 553 being greater than the predetermined number of times of detachment and the battery charge/discharge count of the second battery 353, 453, or 553 being greater than the predetermined number of charge/discharge times, and configure the display attribute of the second battery 353, 453, or 553 to the second display attribute based on the battery detachment count of the second battery 353, 453, or 553 being equal to or less than the predetermined number of times of detachment and the battery charge/discharge count of the second battery 353, 453, or 553 being equal to less than the predetermined number of charge/discharge times.

According to various embodiments, the first display attribute and the second display attribute are different.

According to various embodiments, the electronic device 501 may further include the haptic module 179 and the sound output circuit 560. The processor 570 may be configured to display, on the display 540 though a user interface, a notification indicating replacement of the first battery 351, 451, or 551, based on the remaining capacity information being equal to or less than the predetermined capacity, or based on the remaining capacity on the first battery 351, 451, or 551 being less than the remaining capacity on the second battery 353, 453, or 553, display, on the display 540 through the user interface, a notification indicating replacement of the second battery 353, 453, or 553, based on the remaining capacity on the second battery 353, 453, or 553 being equal to or less than the predetermined capacity, or based on the remaining capacity on the second battery 353, 453, or 553 being less than the remaining capacity information on the first battery 351, 451, or 551, and output at least one of the notification indicating replacement of the first battery 351, 451, or 551 and the notification indicating replacement of the second battery 353, 453, or 553 as at least one of a vibration through the haptic module 179 and a sound through the sound output circuit 560.

FIG. 6 is a view 600 illustrating a structure of a platform architecture of the electronic device 501, according to various embodiments.

Referring to FIG. 6, the electronic device (e.g., the electronic device 501 in FIG. 5) may process the notification function related to the battery and/or manage the information related to the battery based on the structure of the platform architecture.

According to various embodiments, the platform architecture of the electronic device 501 illustrated in FIG. 6 may be implemented as software by being executed by the processor (e.g., the processor 570 in FIG. 5) and loaded into the memory (e.g., the memory 520 in FIG. 5). For example, the constitution of the electronic device 501 implemented as software may include a hardware layer 605, a kernel layer 610, a framework layer 620 (e.g., the middleware 144 in FIG. 1), and/or an application layer 630 (e.g., the application 146 in FIG. 1).

According to various embodiments, the hardware layer 605 may include a hardware module or constitution included in the electronic device 501, for example, the sensor circuit 530 and/or the battery 550. However, the present disclosure is not limited thereto. The hardware layer may include the constitutions illustrated in FIG. 1 or 5.

According to various embodiments, the sensor circuit 530 may include at least one grip sensor. The at least one grip sensor may acquire a sensor signal related to a gripped state of the electronic device 501 and sensor signals related to detached states of the first cover (e.g., the first rear surface cover 361 in FIGS. 3A and 3B or the first rear surface cover 461 in FIGS. 4A and 4B) and/or the second cover (e.g., the second rear surface cover 363 in FIGS. 3A and 3B or the second rear surface cover 463 in FIGS. 4A and 4B). The sensor circuit 530 may transmit the acquired sensor signal to a sensor driver 611 of the kernel layer 610.

According to various embodiments, the battery 550 (or the power gauge 230 in FIG. 2 or the battery protection circuit (e.g., the PCM 240 in FIG. 2)) may transmit the capacity information and/or state information (e.g., the battery detachment count and/or the battery charge/discharge count) on the first battery 551 and the capacity information and/or state information (e.g., the battery detachment count and/or the battery charge/discharge count) on the second battery 553 to a battery driver 613 of the kernel layer 610.

According to various embodiments, the kernel layer 610 may include various drivers for controlling various hardware modules (e.g., the wireless communication circuit 510, the sensor circuit 530, the display 540, the battery 550, and/or the sound output circuit 560 in FIG. 5) included in the electronic device 501. For example, the kernel layer 610 may include: the sensor driver 611 including an interface module for controlling a sensor controller connected to the sensor circuit 530; and/or the battery driver 613 for controlling the battery 550.

According to various embodiments, the sensor driver 611 may detect the detached state of the first cover (first rear surface cover 361 or first rear surface cover 461) and/or the second cover (second rear surface cover 363 or second rear surface cover 463) of the electronic device 501 based on the sensor signal received from the sensor circuit 530 and transmit information on the detached state to a sensor manager 621 of the framework layer 620.

According to various embodiments, the battery driver 613 may transmit the capacity information and/or state information on the first battery 551 received from the battery 550 and the capacity information and/or state information on the second battery 553 received from the battery 550 to a battery management manager 623 of the framework layer 620.

According to various embodiments, the framework layer 620 may provide the application layer 630 with functions provided from one or more resources of the electronic device 501 or various functions so that the information may be used for the application layer 630. For example, the framework layer 620 may include the sensor manager 621 and/or the battery management manager 623.

According to various embodiments, the sensor manager 621 may manage the sensor signal (e.g., the sensor signal related to the detached state of the first cover (first rear surface cover 361 or first rear surface cover 461) and/or the second cover (second rear surface cover 363 or second rear surface cover 463)) acquired through the sensor driver 611.

According to various embodiments, the battery management manager 623 may manage the capacity information and/or state information on the first battery 551 received from the battery driver 613 and the capacity information and/or state information on the second battery 553 received from the battery driver 613.

According to various embodiments, the application layer 630 may include an application stored in the memory 520 of the electronic device 501, an application capable of being executed by the processor 570, or an application installed by the processor 570, for example, a notification application 631 and/or a battery management application 633. However, the present disclosure is not limited thereto.

According to various embodiments, the notification application 631 may be an application that provides the battery information on the respective batteries (first battery 551 and second battery 553), provides the notification related to the replacement of the respective batteries (first battery 551 and second battery 553), and/or provides the information related to the charging of the respective batteries (first battery 551 and second battery 553).

According to various embodiments, the battery management application 633 may be an application that manages the state information on the respective batteries (first battery 551 and second battery 553), for example, the battery detachment count and/or the battery charge/discharge count.

FIG. 7 is a flowchart 700 for explaining a method of displaying information on a plurality of batteries, according to various embodiments.

Referring to FIG. 7, in operation 710, the processor (e.g., the processor 570 in FIG. 5) of the electronic device (e.g., the electronic device 501 in FIG. 5) may identify the remaining capacity of the first battery (e.g., the first battery 351 in FIGS. 3A and 3B, the first battery 451 in FIGS. 4A and 4B, or the first battery 551 in FIG. 5) and the remaining capacity of the second battery (e.g., the second battery 353 in FIGS. 3A and 3B, the second battery 453 in FIGS. 4A and 4B, and the second battery 553 in FIG. 5).

According to various embodiments, the first battery 551 may be detachably disposed in the internal space of the first housing (e.g., the first housing 310 in FIGS. 3A and 3B or the first housing 410 in FIGS. 4A and 4B) of the electronic device 501. The second battery 553 may be detachably disposed in the internal space of the second housing (e.g., the second housing 320 in FIGS. 3A and 3B or the second housing 420 in FIGS. 4A and 4B) of the electronic device 501. According to various embodiments, the first battery 551 and second battery 553 may be identical or different in at least one of the types or capacities (or maximum capacities).

According to various embodiments, the processor 570 may acquire the remaining capacity information including the remaining capacity of the first battery 551 and the remaining capacity of the second battery 553 from the fuel gauge (e.g., the power gauge 230 in FIG. 2) and identify the remaining capacity information. For example, the power gauge 230 may measure the remaining capacity of the first battery 551 and the remaining capacity of the second battery 553. The power gauge 230 may transmit the remaining capacity information including the measured remaining capacity of the first battery 551 and the measured remaining capacity of the second battery 553 to the processor 570.

According to various embodiments, the embodiment has been described in which the remaining capacity information including the remaining capacity of the first battery 551 and the remaining capacity of the second battery 553 is acquired from the power gauge 230. However, the present disclosure is not limited thereto. For example, according to various embodiments, the power gauge 230 may include first and second fuel gauges. In this case, the processor 570 may acquire first remaining capacity information on the remaining capacity of the first battery 551 from the first fuel gauge and acquire second remaining capacity information on the remaining capacity of the second battery 553 from the second fuel gauge.

The present disclosure is not limited thereto. The battery (first battery 551 or second battery 553) may include the battery protection circuit (e.g., the PCM 240 in FIG. 2). The battery protection circuit included in the battery (first battery 551 or second battery 553) may measure the remaining capacity of the battery (first battery 551 or second battery 553) and transmit the remaining capacity information on the measured remaining capacity of the battery (first battery 551 or second battery 553) to the processor 570.

According to various embodiments, the processor 570 may acquire the remaining capacity information including the remaining capacity of the first battery 551 and the remaining capacity of the second battery 553 at a predetermined time interval or in real time from the power gauge 230 (or the PCM 240).

According to various embodiments, in operation 720, the processor 570 may display the integrated battery information on the first battery 551 and second battery 553 based on the remaining capacity of the first battery 551 and the remaining capacity of the second battery 553.

According to various embodiments, the processor 570 may calculate the overall remaining capacity of the first battery 551 and second battery 553 based on the remaining capacity of the first battery 551 and the remaining capacity of the second battery 553. The processor 570 may display integrated battery information including the calculated overall remaining capacity of the first battery 551 and second battery 553 on the display (e.g., the display 540 in FIG. 5).

For example, the processor 570 may calculate a percentage by dividing the overall remaining capacity of the first battery 551 and second battery 553 by a total capacity of the first battery 551 and second battery 553. The processor 570 may display the integrated battery information as the calculated percentage. As another example, the processor 570 may display the integrated battery information by filling an object (e.g., an icon) indicating the battery 550 based on the calculated percentage. As still another example, the processor 570 may display, as the integrated battery information, the calculated percentage and the object (e.g., the icon) indicating the battery 550 and filled based on the calculated percentage. However, the present disclosure is not limited thereto.

According to various embodiments, in operation 730, the processor 570 may display the first battery information on the first battery 551 and the second battery information on the second battery 553 in case that the remaining capacity of at least one of the first battery 551 and second battery 553 is detected to be equal to or smaller than the predetermined capacity or the detachment of at least one of the first cover (e.g., the first rear surface cover 361 in FIGS. 3A and 3B or the first rear surface cover 461 in FIGS. 4A and 4B) and the second cover (e.g., the second rear surface cover 363 in FIGS. 3A and 3B or the second rear surface cover 463 in FIGS. 4A and 4B) is detected by the sensor circuit (e.g., the sensor circuit 530 in FIG. 5).

According to various embodiments, the processor 570 may identify whether the remaining capacity of the first battery 551 and/or the remaining capacity of the second battery 553 acquired from the power gauge 230 (or the PCM 240) is detected to be equal to or smaller than the predetermined capacity (e.g., equal to or smaller than a predetermined ratio (e.g., 10% or 20%) in comparison with the total capacity of the first battery 551 or second battery 553). When the remaining capacity of the first battery 551 and/or the remaining capacity of the second battery 553 is detected to be equal to or smaller than the predetermined capacity, the processor 570 may display the first battery information on the first battery 551 and the second battery information on the second battery 553.

According to various embodiments, the electronic device 501 may include: the first cover (first rear surface cover 361 or first rear surface cover 461) disposed on the rear surface (e.g., the surface disposed in the −z-axis direction in FIGS. 3 and 4) of the first housing (first housing 310 or first housing 410); and the second cover (second rear surface cover 363 or second rear surface cover 463) disposed on the rear surface (e.g., the surface disposed in the −z-axis direction in FIGS. 3 and 4) of the second housing (second housing 320 or second housing 420).

According to various embodiments, the processor 570 may acquire a sensor signal related to the detachment of the first cover (first rear surface cover 361 or first rear surface cover 461) and/or the second cover (second rear surface cover 363 or second rear surface cover 463) through the sensor circuit 530 and identify whether the detachment of the first cover (first rear surface cover 361 or first rear surface cover 461) and/or the second cover (second rear surface cover 363 or second rear surface cover 463) is detected based on the sensor signal. When the detachment of at least one of the first cover (first rear surface cover 361 or first rear surface cover 461) and/or the second cover (second rear surface cover 363 or second rear surface cover 463) is detected, the processor 570 may display the first battery information on the first battery 551 and the second battery information on the second battery 553.

According to various embodiments, the processor 570 may calculate a percentage by dividing the remaining capacity of the first battery 551 by the total capacity of the first battery 551 and display the first battery information on the first battery 551 based on the calculated percentage. The processor 570 may calculate the percentage by dividing the remaining capacity of the second battery 553 by the total capacity of the second battery 553 and display the second battery information on the second battery 553 based on the calculated percentage.

According to various embodiments, the first battery information and the second battery information may be displayed as the calculated percentage and/or displayed by filling the object (e.g., the icon) indicating the respective batteries (first battery 551 and second battery 553) based on the calculated percentage.

According to various embodiments, the processor 570 may configure the different display attributes and display the first battery information on the first battery 551 and the second battery information on the second battery 553.

According to various embodiments, in case that the remaining capacity of at least one of the first battery 551 and second battery 553 is detected to be equal to or smaller than the predetermined capacity, the processor 570 may recognize this situation as a situation in which the battery having the remaining capacity equal to or smaller than the predetermined capacity needs to be replaced. Further, the processor 570 may differently display the first battery information on the first battery 551 and the second battery information on the second battery 553. For example, the processor 570 may differently configure and display the display attribute (e.g., the color, effect, and/or size) indicating battery information on the battery having the remaining capacity equal to or smaller than the predetermined capacity, and the display attribute (e.g., the color, effect, and/or size) indicating battery information on the battery having the remaining capacity larger than the predetermined capacity.

According to various embodiments, in case that the detachment of at least one of the first cover (first rear surface cover 361 or first rear surface cover 461) and/or the second cover (second rear surface cover 363 or second rear surface cover 463) is detected by the sensor circuit 530, the processor 570 may recognize this situation as a situation in which a user replaces the battery (e.g., the first battery 551 and/or the second battery 553). Further, the processor 570 may differently display the first battery information on the first battery 551 and the second battery information on the second battery 553. For example, the processor 570 may differently configure and display the display attribute (e.g., the color, effect, and/or size) indicating battery information on the battery having the remaining capacity equal to or smaller than the predetermined capacity, and the display attribute (e.g., the color, effect, and/or size) indicating battery information on the battery having the remaining capacity larger than the predetermined capacity.

According to various embodiments, in case that the remaining capacity of the first battery 551 and the remaining capacity of the second battery 553 are larger than the predetermined capacity, the processor 570 may compare the remaining capacity of the first battery 551 and the remaining capacity of the second battery 553. Based on the comparison result, the processor 570 may configure and display the display attribute indicating the battery information on the battery having the smaller remaining capacity between the first battery 551 and second battery 553 differently from the display attribute indicating the battery information on the other battery.

According to various embodiments, the display attribute indicating the first battery information on the first battery 551 and the display attribute indicating the second battery information on the second battery 553 are differently configured and displayed in case that the remaining capacity of at least one of the first battery 551 and second battery 553 is detected to be equal to or smaller than the predetermined capacity or the detachment of at least one of the first and second covers (first rear surface cover 361, first rear surface cover 461, second rear surface cover 363, and second rear surface cover 463) is detected by the sensor circuit 530. However, the present disclosure is not limited thereto.

For example, the processor 570 may display a user interface (UI) including a notification informing of the replacement of the battery (e.g., the battery having the remaining capacity equal to or smaller than the predetermined capacity between the first battery 551 and second battery 553 or the battery having the smaller remaining capacity between the first battery 551 and second battery 553).

As another example, the processor 570 may output the notification informing of the replacement of the battery by using vibration through the haptic module (e.g., the haptic module 179 in FIG. 1) and/or output the notification informing of the replacement of the battery by using sound through the sound output circuit (e.g., the sound output circuit 560 in FIG. 5).

As still another example, in case that the detachment of the battery (e.g., the battery having the remaining capacity larger than the predetermined capacity), which is not the battery (e.g., the battery having the remaining capacity equal to or smaller than the predetermined capacity) required to be replaced, is detected, the processor 570 may output, through the user interface, sound, and/or vibration, the notification informing that the battery (e.g., the battery that is not required to be replaced), which is not the battery required to be replaced, is detached.

Referring to FIG. 7 the first battery information on the first battery 551 and the second battery information on the second battery 553 are displayed in case that the remaining capacity of at least one of the first battery 551 and second battery 553 is detected to be equal to or smaller than the predetermined capacity or the detachment of at least one of the first and second covers (first rear surface cover 361, first rear surface cover 461, second rear surface cover 363, and second rear surface cover 463) is detected by the sensor circuit 530 while the integrated battery information on the first battery 551 and second battery 553 is displayed. However, the present disclosure is not limited thereto.

For example, the processor 570 may identify whether at least one of the first battery 551 and second battery 553 is in a discharged state. When the processor identifies that at least one of the first battery 551 and second battery 553 is in the discharged state, the processor 570 may display a user interface including a notification informing of the replacement of the battery in the discharged state between the first battery 551 and second battery 553.

As another example, the processor 570 may provide a user interface for selecting first and second modes for displaying battery information. For example, the first mode may be a mode that displays the first battery information on the first battery 551 and the second battery information on the second battery 553 in case that a predetermined condition is satisfied while the integrated battery information on the first battery 551 and second battery 553 is displayed. The second mode may be a mode that displays the first battery information on the first battery 551 and the second battery information on the second battery 553. In this case, the processor 570 may differently display the first battery information on the first battery 551 and the second battery information on the second battery 553 (e.g., differently configure and display the display attributes) in case that a predetermined condition (e.g., the remaining capacity of at least one of the first battery 551 and second battery 553 is detected to be equal to or smaller than the predetermined capacity or the detachment of at least one of the first and second covers (first rear surface cover 361, first rear surface cover 461, second rear surface cover 363, and second rear surface cover 463) is detected by the sensor circuit 530) is satisfied while the first battery information on the first battery 551 and the second battery information on the second battery 553 are displayed.

According to various embodiments, in case that the remaining capacity of at least one of the first battery 551 and second battery 553 is detected to be equal to or smaller than the predetermined capacity, the discharged state of at least one of the first battery 551 and second battery 553 is detected, or the detachment of at least one of the first and second covers (first rear surface cover 361, first rear surface cover 461, second rear surface cover 363, and second rear surface cover 463) is detected by the sensor circuit 530 while the integrated battery information on the first battery 551 and second battery 553 is displayed, the first battery information on the first battery 551 and the information on the second battery 553 are displayed or the display attribute indicating the first battery information on the first battery 551 and the display attribute indicating the second battery information on the second battery 553 are differently configured and displayed. Therefore, the user may intuitively identify the battery required to be replaced and the situation in which the battery needs to be replaced.

FIG. 8 is a flowchart 800 for explaining a method of displaying information on a plurality of batteries, according to various embodiments.

The operations 810, 820, and 830 in FIG. 8 are identical to operations 710, 720, and 730 in FIG. 7, and a detailed description thereof may be replaced with the description described with reference to FIG. 7.

Referring to FIG. 8, in operation 810, the processor (e.g., the processor 570 in FIG. 5) of the electronic device (e.g., the electronic device 501 in FIG. 5) may identify the remaining capacity of the first battery (e.g., the first battery 351 in FIGS. 3A and 3B, the first battery 451 in FIGS. 4A and 4B, or the first battery 551 in FIG. 5) and the remaining capacity of the second battery (e.g., the second battery 353 in FIGS. 3A and 3B, the second battery 453 in FIGS. 4A and 4B, and the second battery 553 in FIG. 5). In operation 820, the processor 570 may display the integrated battery information on the first battery 551 and second battery 553 based on the remaining capacity of the first battery 551 and the remaining capacity of the second battery 553.

According to various embodiments, in operation 830, the processor 570 may identify whether the remaining capacity of at least one of the first battery 551 and second battery 553 is detected to be equal to or smaller than the predetermined capacity or whether the detachment of at least one of the first cover (e.g., the first rear surface cover 361 in FIGS. 3A and 3B or the first rear surface cover 461 in FIGS. 4A and 4B) and the second cover (e.g., the second rear surface cover 363 in FIGS. 3A and 3B or the second rear surface cover 463 in FIGS. 4A and 4B) is detected by the sensor circuit (e.g., the sensor circuit 530 in FIG. 5).

According to various embodiments, when the remaining capacity of at least one of the first battery 551 and second battery 553 is detected to be equal to or smaller than the predetermined capacity or the detachment of at least one of the first and second covers (first rear surface cover 361, first rear surface cover 461, second rear surface cover 363, and second rear surface cover 463) is detected by the sensor circuit 530 (e.g., YES in operation 830), the processor 570 may identify the state information on the first battery 551 and second battery 553 in operation 840.

According to various embodiments, the state information on the first battery 551 and second battery 553 may include the battery detachment count and/or the battery charge/discharge count of the respective first battery 551 and second battery 553.

According to various embodiments, when the detachment of the first battery 551 and/or the second battery 553 from the electronic device 501 is detected, the processor 570 may identify identification (ID) information on the detached battery and count the number of times of detachment. The processor 570 may map the identification information and the battery detachment count of the detached battery (e.g., the first battery 551 and second battery 553) and store the identification information and the battery detachment count (e.g., the memory 520 in FIG. 5). For example, the processor 570 may map the identification information and the battery detachment count of the detached battery (e.g., the first battery 551 and second battery 553) through the database (DB, or digitization) and store the identification information and the battery detachment count in the memory 520.

According to various embodiments, the processor 570 may count the number of battery charge/discharge times of the first battery 551 and the number of battery charge/discharge times of the second battery 553. The processor 570 may map the identification information on the first battery 551 and the counted number of battery charge/discharge times of the first battery 551, map the identification information on the second battery 553 and the counted number of battery charge/discharge times of the second battery 553, and store the identification information on the first battery 551, the counted number of battery charge/discharge times of the first battery 551, the identification information on the second battery 553, and the counted number of battery charge/discharge times of the second battery 553 in the memory 520.

According to various embodiments, the processor 570 may identify the battery detachment count and/or the battery charge/discharge count of the respective batteries (e.g., the first battery 551 and second battery 553) stored in the memory 520.

According to various embodiments, in operation 850, the processor 570 may display the first battery information on the first battery 551 and the second battery information on the second battery 553 based on the remaining capacity and/or state information on the respective batteries (e.g., the first battery 551 and second battery 553).

According to various embodiments, weight values (or priorities) related to the remaining capacity and/or state information, for example, the battery detachment count and/or the battery charge/discharge count of the respective batteries (e.g., the first battery 551 and second battery 553) may be configured in advance to calculate the remaining capacity included in the battery information on the respective batteries (e.g., the first battery 551 and second battery 553).

According to various embodiments, the processor 570 may calculate the percentage related to the remaining capacity of the first battery 551 based on the weight values configured to the total capacity of the first battery 551 and the remaining capacity, the battery detachment count, and the battery charge/discharge count of the first battery 551. The processor 570 may display the first battery information on the first battery 551 based on the calculated percentage. In addition, the processor 570 may calculate the percentage related to the remaining capacity of the second battery 553 based on the weight value configured to the total capacity of the second battery 553 and the remaining capacity, the battery detachment count, and the battery charge/discharge count of the second battery 553. The processor 570 may display the second battery information on the second battery 553 based on the calculated percentage. The present disclosure is not limited thereto. The first battery information on the first battery 551 and the second battery information on the second battery 553 may be displayed by filling the object (e.g., the icon) indicating the respective batteries (first battery 551 and second battery 553) based on the calculated percentage.

According to various embodiments, in case that the remaining capacity of the first battery 551 and the remaining capacity of the second battery 553 are equal to or smaller than the predetermined capacity, the processor 570 may display the first battery information on the first battery 551 and the second battery information on the second battery 553 by additionally considering the state information on the respective batteries.

According to various embodiments, the processor 570 may configure different display attributes (e.g., colors, effects, and/or sizes) and display the first battery information on the first battery 551 and the second battery information on the second battery 553. In case that the remaining capacity of at least one of the first battery 551 and second battery 553 is detected to be equal to or smaller than the predetermined capacity or the detachment of at least one of the first cover (first rear surface cover 361 or first rear surface cover 461) and/or the second cover (second rear surface cover 363 or second rear surface cover 463) is detected by the sensor circuit 530, the processor 570 may recognize a situation in which the battery having the remaining capacity equal to or smaller than the predetermined capacity needs to be replaced or a situation in which the user replaces the battery, and the processor 570 may differently display the first battery information on the first battery 551 and the second battery information on the second battery 553.

For example, the processor 570 may differently configure and display the display attribute (e.g., the color, effect, and/or size) indicating battery information on the battery having the remaining capacity equal to or smaller than the predetermined capacity, and the display attribute (e.g., the color, effect, and/or size) indicating battery information on the battery having the remaining capacity larger than the predetermined capacity, among the remaining capacities of the respective batteries calculated based on the weight values configured to the total capacities of the respective batteries and the remaining capacities, the battery detachment count, and the battery charge/discharge count of the respective batteries.

As another example, in case that the remaining capacity of the battery, which is calculated based on the weight values configured to the total capacity of the battery and remaining capacity, the battery detachment count, and the battery charge/discharge count of the battery, is larger than the predetermined capacity, the processor 570 may configure and display the display attribute indicating the battery information on the battery having the smaller remaining capacity between the remaining capacity of the first battery 551 and the remaining capacity of the second battery 553 different from the display attribute indicating the battery information on the other battery.

As still another example, in case that the remaining capacity of the first battery 551 and the remaining capacity of the second battery 553 are equal to or smaller than the predetermined capacity, the processor 570 may identify whether the battery detachment count of the respective batteries (first battery 551 and second battery 553) is larger than the predetermined number of times of detachment or the battery charge/discharge count of the batteries (first battery 551 and second battery 553) is larger than the predetermined number of battery charge/discharge times. Based on the identification result, the processor 570 may configure and display the display attribute indicating the battery information on the battery having the battery detachment count larger than the predetermined number of times of detachment and/or the display attribute indicating the battery information on the battery having the battery charge/discharge count larger than the predetermined number of battery charge/discharge times differently from the display attribute indicating the battery information on the other battery.

According to various embodiments, when the remaining capacity of at least one of the first battery 551 and second battery 553 is not detected to be equal to or smaller than the predetermined capacity or the detachment of at least one of the first and second covers (first rear surface cover 361, first rear surface cover 461, second rear surface cover 363, and second rear surface cover 463) is not detected by the sensor circuit 530 (e.g., NO in operation 830), the processor 570 may continuously display the integrated battery information on the first battery 551 and second battery 553 in operation 820.

According to various embodiments, the electronic device 501 includes: the hinge module (e.g., the hinge module 330 in FIGS. 3A and 3B or the hinge module 430 in FIGS. 4A and 4B); the first housing (first housing 310 or first housing 410); the second housing (second housing 320 or second housing 420) connected to the hinge module 330 or 430 so as to be foldable with respect to the first housing (first housing 310 or first housing 410); the first battery 351, 451, or 551 detachably disposed in the first internal space of the first housing (first housing 310 or first housing 410); the second battery 353, 453, or 553 detachably disposed in the second internal space of the second housing (second housing 320 or second housing 420); the first cover (first rear surface cover 361 or first rear surface cover 461) disposed on the rear surface of the first housing (first housing 310 or first housing 410); and the second cover (second rear surface cover 363 or second rear surface cover 463) disposed on the rear surface of the second housing (second housing 320 or second housing 420). A method of displaying information on the plurality of batteries of the electronic device 501 may include: an operation of displaying, via a display 540, integrated battery information on the plurality of batteries 351, 451, 551, 353, 453, or 553, based on remaining capacity information on the plurality of batteries 351, 451, 551, 353, 453, or 553; wherein the plurality of batteries 351, 451, 551, 353, 453, or 553 comprise at least a first battery 351, 451, or 551 detachably disposed in a first internal space of a first housing (first housing 310 or first housing 410) of the electronic device 501, and a second battery 353, 453, or 553 detachably disposed in a second internal space of a second housing (second housing 320 or second housing 420) of the electronic device 501, and wherein the remaining capacity information on the plurality of batteries 351, 451, 551, 353, 453, or 553 comprises at least a remaining capacity on the first battery 351, 451, or 551 and a remaining capacity on the second battery 353, 453, or 553; and an operation of displaying first battery information on the first battery 351, 451, or 551 and second battery information on the second battery 353, 453, or 553, based on detecting that at least one of the remaining capacity on the first battery 351, 451, or 551 and the remaining capacity on the second battery 353, 453, or 553 is equal to or less than a predetermined capacity, or based on detecting a detachment of at least one of a first cover (first rear surface cover 361 or first rear surface cover 461) and a second cover (second rear surface cover 363 or second rear surface cover 463) by a sensor circuit 530, wherein the first cover (first rear surface cover 361 or first rear surface cover 461) is disposed on a rear surface of the first housing (first housing 310 or first housing 410), and the second cover (second rear surface cover 363 or second rear surface cover 463) is disposed on a rear surface of the second housing (second housing 320 or second housing 420).

According to various embodiments, the operation of displaying the first battery information on the first battery 351, 451, or 551 and the second battery information on the second battery 353, 453, or 553 may include an operation of displaying the first battery information based on the remaining capacity of the first battery 351, 451, or 551 and displaying the second battery information based on the remaining capacity of the second battery 353, 453, or 553.

According to various embodiments, the operation of displaying the first battery information on the first battery 351, 451, or 551 and the second battery information on the second battery 353, 453, or 553 may include an operation of configuring a display attribute for each of the first battery 351, 451, or 551 and the second battery 353, 453, or 553 to be different from each other; and an operation of displaying the display attribute of the first battery 351, 451, or 551 and the display attribute of the second battery 353, 453, or 553 based on the differently configured display attributes.

According to various embodiments, the display attribute may include at least one of a color, a visual effect, and a display size.

According to various embodiments, the method of displaying information on the plurality of batteries of the electronic device 501 may further include an operation of comparing the remaining capacity on the first battery 351, 451, or 551 and the remaining capacity on the second battery 353, 453, or 553 based on detecting that the remaining capacity on the first battery 351, 451, or 551 and the remaining capacity on the second battery 353, 453, or 553 are greater than the predetermined capacity, an operation of configuring the display attribute of the first battery 351, 451, or 551 and the display attribute of the second battery 353, 453, or 553 to be different from each other based on a result of the comparing, and an operation of displaying battery information on a battery having a smaller remaining capacity among the first battery 351, 451, or 551 and the second battery 353, 453, or 553 and battery information on the other battery differently, based on the differently configured display attributes.

According to various embodiments, the method of displaying information on the plurality of batteries of the electronic device 501 may further include an operation of identifying battery state information of the plurality of batteries based on detecting that at least one of the remaining capacity on the first battery 351, 451, or 551 and the remaining capacity on the second battery 353, 453, or 553 is equal to or less than the predetermined capacity, or based on detecting the detachment of at least one of the first cover (first rear surface cover 361 or first rear surface cover 461) and the second cover (second rear surface cover 363 or second rear surface cover 463), wherein the battery state information comprises at least state information on the first battery 351, 451, or 551 and state information on the second battery 353, 453, or 553, and an operation of displaying the first battery information on the first battery 351, 451, or 551 and the second battery information on the second battery 353, 453, or 553 based on at least one of the remaining capacity information and the battery state information.

According to various embodiments, the battery state information may include the battery detachment count and/or the battery charge/discharge count.

According to various embodiments, the method of displaying information on the plurality of batteries of the electronic device 501 may further include an operation of incrementing at least one of a battery detachment count of the first battery 351, 451, or 551 and a battery detachment count of the second battery 353, 453, or 553 based on detecting a detachment of at least one of the first battery 351, 451, or 551 and second battery 353, 453, or 553, an operation of mapping identification information of the first battery 351, 451, or 551 and the battery detachment count of the first battery 351, 451, or 551 based on detecting the detachment of the first battery 351, 451, or 551, and storing the mapping of the identification information of the first battery 351, 451, or 551 and the battery detachment count of the first battery 351, 451, or 551 in a memory 520, and an operation of mapping identification information of the second battery 353, 453, or 553 and the battery detachment count of the second battery 353, 453, or 553 based on detecting the detachment of the second battery 353, 453, or 553, and storing the mapping of the identification information of the second battery 353, 453, or 553 and the battery detachment count of the second battery 353, 453, or 553 in the memory 520.

According to various embodiments, the method of displaying information on the plurality of batteries of the electronic device 501 may further include an operation of identifying a battery charge/discharge count of the first battery 351, 451, or 551 and a battery charge/discharge count of the second battery 353, 453, or 553, an operation of mapping the identification information of the first battery 351, 451, or 551 and the battery charge/discharge count of the first battery 351, 451, or 551, and storing the mapping of the identification information of the first battery 351, 451, or 551 and the battery charge/discharge count of the first battery 351, 451, or 551 in the memory 520, and an operation of mapping the identification information of the second battery 353, 453, or 553 and the battery charge/discharge count of the second battery 353, 453, or 553, and storing the mapping of the identification information of the second battery 353, 453, or 553 and the battery charge/discharge count of the second battery 353, 453, or 553 in the memory 520.

According to various embodiments, the operation of displaying the first battery information on the first battery 351, 451, or 551 and the second battery information on the second battery 353, 453, or 553 may further include an operation of identifying whether each of the battery detachment count of the first battery 351, 451, or 551 and the battery detachment count of the second battery 353, 453, or 553 is greater than a predetermined number of times of detachment, or whether each of the battery charge/discharge count of the first battery 351, 451, or 551 and the battery charge/discharge count of the second battery 351, 451, or 551 is greater than a predetermined number of charge/discharge times, an operation of configuring a display attribute of the first battery 351, 451, or 551 to a first display attribute based on at least one of the battery detachment count of the first battery 351, 451, or 551 being greater than the predetermined number of times of detachment and the battery charge/discharge count of the first battery 351, 451, or 551 being greater than the predetermined number of charge/discharge times, and configuring the display attribute of the first battery 351, 451, or 551 to a second display attribute based on the battery detachment count of the first battery 351, 451, or 551 being equal to or less than the predetermined number of times of detachment and the battery charge/discharge count of the first battery 351, 451, or 551 being equal to less than the predetermined number of charge/discharge times, and an operation of configuring a display attribute of the second battery 353, 453, or 553 to the first display attribute based on at least one of the battery detachment count of the second battery 353, 453, or 553 being greater than the predetermined number of times of detachment and the battery charge/discharge count of the second battery 353, 453, or 553 being greater than the predetermined number of charge/discharge times, and configuring the display attribute of the second battery 353, 453, or 553 to the second display attribute based on the battery detachment count of the second battery 353, 453, or 553 being equal to or less than the predetermined number of times of detachment and the battery charge/discharge count of the second battery 353, 453, or 553 being equal to less than the predetermined number of charge/discharge times.

According to various embodiments, the first display attribute and the second display attribute are different.

According to various embodiments, the operation of displaying the first battery information on the first battery 351, 451, or 551 and the second battery information on the second battery 353, 453, or 553 may include an operation of displaying, on the display 540 though a user interface, a notification indicating replacement of the first battery 351, 451, or 551, based on the remaining capacity information being equal to or less than the predetermined capacity, or based on the remaining capacity on the first battery 351, 451, or 551 being less than the remaining capacity on the second battery 353, 453, or 553, an operation of displaying, on the display 540 through the user interface, a notification indicating replacement of the second battery 353, 453, or 553, based on the remaining capacity on the second battery 353, 453, or 553 being equal to or less than the predetermined capacity, or based on the remaining capacity on the second battery 353, 453, or 553 being less than the remaining capacity information on the first battery 351, 451, or 551, and an operation of outputting at least one of the notification indicating replacement of the first 351, 451, or 551 battery and the notification indicating replacement of the second battery 353, 453, or 553 as at least one of a vibration through a haptic module 179 and a sound through a sound output circuit 560.

Figure 9A:
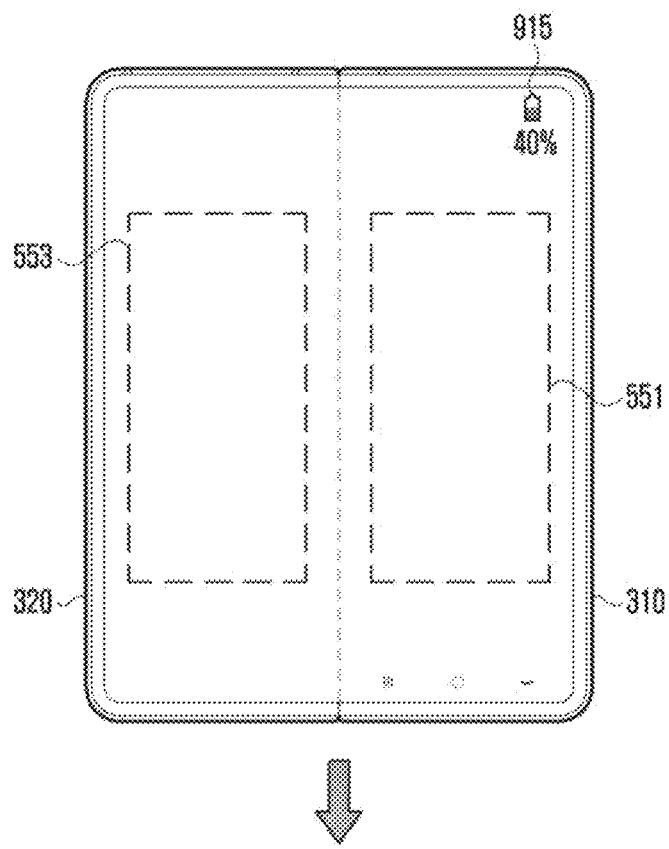
FIG. 9A and FIG. 9B are views for explaining a method of displaying information on the plurality of batteries, according to various embodiments.
Figure 9B:
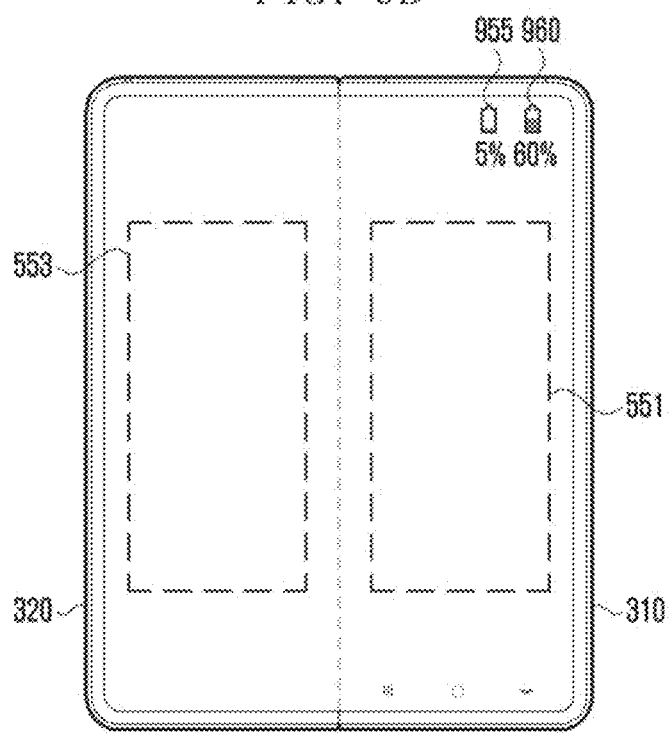

FIG. 9A and FIG. 9B are views for explaining a method of displaying information on the plurality of batteries, according to various embodiments.

Referring to FIGS. 9A and 9B, the processor (e.g., the processor 570 in FIG. 5) of the electronic device (e.g., the electronic device 501 in FIG. 5) may display integrated battery information 915 on the first battery 551 and second battery 553 in a partial area (e.g., an indicator area) of the display (e.g., the display 540 in FIG. 5).

According to various embodiments, the processor 570 may acquire the remaining capacity information including the remaining capacity of the first battery 551 and the remaining capacity of the second battery 553 from a fuel gauge (e.g., the power gauge 230 in FIG. 2 or a battery protection circuit (e.g., the PCM 240 in FIG. 2)). The processor 570 may calculate the overall remaining capacity of the first battery 551 and second battery 553 based on the remaining capacity of the first battery 551 and the remaining capacity of the second battery 553. The processor 570 may display the integrated battery information including the calculated overall remaining capacity of the first battery 551 and second battery 553. For example, the integrated battery information may be displayed based on the percentage (e.g., 40%) calculated by dividing the overall remaining capacity of the first battery 551 and second battery 553 by the total capacity of the first battery 551 and second battery 553. The present disclosure is not limited thereto. The integrated battery information may be displayed through the object (e.g., the icon) indicating the battery filled based on the calculated percentage (e.g., 40%).

According to various embodiments, when the remaining capacity of at least one of the first battery 551 and second battery 553 is detected to be equal to or smaller than the predetermined capacity, the processor 570 may display the first battery information 960 on the first battery 551 and the second battery information 955 on the second battery 553 in a partial area (e.g., an indicator area) of the display 540, as shown in FIG. 9B.

For example, the first battery information 960 may be displayed based on the percentage (e.g., 60%) calculated by dividing the remaining capacity of the first battery 551 by the total capacity of the first battery 551. The present disclosure is not limited thereto. The first battery information 960 may be displayed through the object (e.g., the icon) indicating the battery filled based on the calculated percentage (e.g., 60%). The second battery information 955 may be displayed based on the percentage (e.g., 5%) calculated by dividing the remaining capacity of the second battery 553 by the total capacity of the second battery 553. The present disclosure is not limited thereto. The second battery information 955 may be displayed through the object (e.g., the icon) indicating the battery filled based on the calculated percentage (e.g., 5%).

According to various embodiments, the processor 570 may display the first battery information 960 on the first battery 551 and the second battery information 955 on the second battery 553 in the partial area (e.g., the indicator area) of the display 540 as shown in FIG. 9B, in case that the detachment of at least one of the first cover (e.g., the first rear surface cover 361 in FIGS. 3A and 3B or the first rear surface cover 461 in FIGS. 4A and 4B) and the second cover (e.g., the second rear surface cover 363 in FIGS. 3A and 3B or the second rear surface cover 463 in FIGS. 4A and 4B) is detected by the sensor circuit (e.g., the sensor circuit 530 in FIG. 5) while the integrated battery information 915 is displayed as shown in FIG. 9A.

According to various embodiments, in case that the remaining capacity of the first battery 551 and the remaining capacity of the second battery 553 are equal to or smaller than the predetermined capacity, the processor 570 may display the first battery information on the first battery 551 and the second battery information on the second battery 553 by additionally considering the state information (e.g., the battery detachment count and/or the battery charge/discharge count) on the respective batteries.

FIG. 10A, FIG. 10B, and FIG. 10C are views for explaining a method of displaying information on the plurality of batteries, according to various embodiments.

Displaying the information on the plurality of batteries may include displaying the first battery information on the first battery 551 and the second battery information on the second battery 553 based on the remaining capacity and/or state information (e.g., the battery detachment count and/or the battery charge/discharge count) of the respective batteries (e.g., the first battery 551 and second battery 553) in case that the remaining capacity of at least one of the first battery 551 and second battery 553 is detected to be equal to or smaller than the predetermined capacity or the detachment of at least one of the first cover (e.g., the first rear surface cover 361 in FIGS. 3A and 3B or the first rear surface cover 461 in FIGS. 4A and 4B) and the second cover (e.g., the second rear surface cover 363 in FIGS. 3A and 3B or the second rear surface cover 463 in FIGS. 4A and 4B) is detected by the sensor circuit (e.g., the sensor circuit 530 in FIG. 5).

Referring to FIGS. 10A, 10B, and 10C, the processor (e.g., the processor 570 in FIG. 5) of the electronic device (e.g., the electronic device 501 in FIG. 5) may display the first battery information 1015 on the first battery 551 (e.g., 60%) and the second battery information 1020 on the second battery 553 (e.g., 5%) based on the remaining capacity and/or state information (e.g., the battery detachment count and/or the battery charge/discharge count) of the respective batteries (e.g., the first battery 551 and second battery 553). For example, the processor 570 may calculate the remaining capacities of the respective batteries based on the total capacities, the remaining capacities, and/or state information on the respective batteries (e.g., the first battery 551 and second battery 553). The processor 570 may differently configure and display the display attribute (e.g., the color, effect, and/or size) indicating battery information on the battery having the remaining capacity equal to or smaller than the predetermined capacity, and the display attribute (e.g., the color, effect, and/or size) indicating battery information on the battery having the remaining capacity larger than the predetermined capacity, among the calculated remaining capacities of the respective batteries (e.g., the first battery 551 and second battery 553).

According to various embodiments, when the processor 570 identifies whether at least one of the first battery 551 and second battery 553 is in the discharged state and identifies that at least one of the first battery 551 and second battery 553 is in the discharged state, the processor 570 may differently configure and display the display attribute indicating the battery information on the battery in the discharged state and the display attribute indicating the battery information on the battery that is not in the discharged state.

For example, as shown in FIG. 10A, the processor 570 may output the second battery information 1020 by applying a visual effect 1025 (e.g., a visual effect of flickering) to the object (e.g., the icon) indicating the battery (e.g., the second battery 553 or the battery of the discharged state) having the remaining capacity equal to or smaller than the predetermined capacity.

As another example, the processor 570, as shown in FIG. 10B, a visual effect may be outputted to an area 1035 of the display 540 on the front surface of the housing (e.g., a second area 343 of the display 340 disposed on the front surface of the second housing 320 in FIGS. 3A and 3B or a second area 443 of the display 440 disposed on the front surface of the second housing 420 in FIGS. 4A and 4B) in which the battery to be replaced is disposed.

As still another example, the processor 570 may display, on the display 540, a pop-up window 1055 including a notification message (e.g., "PLEASE CHANGE SECOND BATTERY") informing of the replacement of the battery (or the battery in the discharged state) having the remaining capacity equal to or smaller than the predetermined capacity as shown in FIG. 10C.

As still another example, the processor 570 may output the notification informing of the replacement of the battery (or the battery in the discharged state) having the remaining capacity equal to or smaller than the predetermined capacity by using vibration through the haptic module (e.g., the haptic module 179 in FIG. 1) and/or output the notification informing of the replacement of the battery (or the battery in the discharged state) having the remaining capacity equal to or smaller than the predetermined capacity by using sound through the sound output circuit (e.g., the sound output circuit 560 in FIG. 5).

As still another example, the processor 570 may display only the battery information on the battery in the discharged state between the first battery 551 and second battery 553 on the display 540. Because only the battery information on the battery in the discharged state is displayed on the display 540, the user may intuitively identify the replacement situation of the battery.

As still another example, in case that the electronic device 501 communicates with and connects to the external electronic device (e.g., a wearable device (e.g., a wireless audio device or a smart watch)) through the wireless communication circuit (e.g., the wireless communication circuit 510 in FIG. 5), the electronic device 501 may transmit information, which is related to the replacement of the battery 550 (e.g., the first battery 551 and/or the second battery 553 or the battery in the discharged state) having the remaining capacity equal to or smaller than the predetermined capacity, to the external electronic device. The external electronic device may output the notification informing of the replacement of the battery 550 (e.g., the first battery 551 and/or the second battery 553) of the electronic device 501 based on the information related to the replacement of the battery 550 (e.g., the first battery 551 and/or the second battery 553) received from the electronic device 510.

As yet another example, in case that the detachment of the battery (e.g., the battery having the remaining capacity larger than the predetermined capacity (or the battery that is not the battery in the discharged state)), which is not the battery required to be replaced (e.g., the battery instructed to be replaced (e.g., the battery having the remaining capacity equal to or smaller than the predetermined capacity or the battery in the discharged state)), is detected (or the detachment of the cover, which is not the cover disposed on the rear surface of the housing in which the battery required to be replaced is disposed, is detected), the processor 570 may output a notification, which informs that the battery (e.g., the battery that is not is required to be replaced), which is not the battery to be replaced, is detached through a user interface (e.g., a pop-up window including a notification message (e.g., "FIRST BATTERY IS DETACHED INSTEAD OF SECOND BATTERY")), sound, and/or vibration. Therefore, the user may intuitively identify that the battery, which is not the battery to be replaced, is detached.

The various embodiments of the present disclosure have been shown and described above with reference to the accompanying drawings. The embodiments disclosed in the specification and drawings are only intended to provide specific examples for easily describing the technical content of the disclosure and for assisting understanding of the disclosure, and are not intended to limit the scope of the disclosure. It will be understood by those of ordinary skill in the art that the present disclosure may be easily modified into other detailed forms without changing the technical principle or essential features of the present disclosure, and without departing from the gist of the disclosure as claimed by the appended claims and their equivalents. Therefore, it should be interpreted that the scope of the disclosure includes all changes or modifications derived based on the technical idea of the disclosure in addition to the embodiments disclosed herein.

What is claimed is:

1. An electronic device comprising:
    a hinge module;
    a first housing;
    a second housing connected to the hinge module, and configured to be foldable with respect to the first housing;
    a plurality of batteries comprising at least a first battery detachably disposed in a first internal space of the first housing, and a second battery detachably disposed in a second internal space of the second housing;
    a first cover detachably disposed on a rear surface of the first housing;
    a second cover detachably disposed on a rear surface of the second housing;
    a sensor circuit;
    a display;
    memory storing instructions; and
    at least one processor operatively connected to the first battery, the second battery, the sensor circuit, the display, and the memory, wherein the at least one processor is configured to execute the instructions to:
    display, on the display, integrated battery information on the plurality of batteries, based on remaining capacity information on the plurality of batteries, wherein the remaining capacity information comprises at least a remaining capacity on the first battery and a remaining capacity on the second battery, and
    display, on the display, first battery information on the first battery and second battery information on the second battery, based on detecting that at least one of the remaining capacity on the first battery and the remaining capacity on the second battery is equal to or less than a predetermined capacity, or based on detecting a detachment of at least one of the first cover and the second cover by the sensor circuit.

2. The electronic device of claim 1, wherein the at least one processor is further configured to execute the instructions to:
    display, on the display, the first battery information based on the remaining capacity of the first battery; and
    display, on the display, the second battery information based on the remaining capacity of the second battery.

3. The electronic device of claim 1, wherein the at least one processor is further configured to execute the instructions to:
    configure a display attribute for each of the first battery and the second battery to be different from each other; and
    display, on the display, the first battery information on the first battery and the second battery information on the second battery based on the differently configured display attributes,
    wherein the display attribute comprises at least one of a color, a visual effect, and a display size.

4. The electronic device of claim 3, wherein the at least one processor is further configured to execute the instructions to:
    compare the remaining capacity on the first battery and the remaining capacity on the second battery based on detecting that the remaining capacity on the first battery and the remaining capacity on the second battery are greater than the predetermined capacity;
    configure the display attribute for each of the first battery and the second battery to be different from each other based on a result of the comparing; and
    display, on the display, battery information on a battery having a smaller remaining capacity among the first battery and the second battery and battery information on the other battery differently, based on the differently configured display attributes.

5. The electronic device of claim 1, wherein the at least one processor is further configured to execute the instructions to:
    identify battery state information of the plurality of batteries based on detecting that at least one of the remaining capacity on the first battery and the remaining capacity on the second battery is equal to or less than the predetermined capacity, or based on detecting the detachment of at least one of the first cover and the second cover, wherein the battery state information comprises at least state information on the first battery and state information on the second battery; and
    display, on the display, the first battery information on the first battery and the second battery information on the second battery based on at least one of the remaining capacity information and the battery state information.

6. The electronic device of claim 5, wherein the battery state information comprises at least one of a battery detachment count and a battery charge/discharge count.

7. The electronic device of claim 6, wherein the at least one processor is further configured to execute the instructions to:
    increment at least one of a battery detachment count of the first battery and a battery detachment count of the second battery based on detecting a detachment of at least one of the first battery and the second battery;
    map identification information of the first battery and the battery detachment count of the first battery based on detecting the detachment of the first battery, and store the mapping of the identification information of the first battery and the battery detachment count of the first battery in the memory; and
    map identification information of the second battery and the battery detachment count of the second battery based on detecting the detachment of the second battery, and store the mapping of the identification information of the second battery and the battery detachment count of the second battery in the memory.

8. The electronic device of claim 7, wherein the at least one processor is further configured to execute the instructions to:
    identify a battery charge/discharge count of the first battery and a battery charge/discharge count of the second battery;
    map the identification information of the first battery and the battery charge/discharge count of the first battery, and store the mapping of the identification information of the first battery and the battery charge/discharge count of the first battery in the memory; and
    map the identification information of the second battery and the battery charge/discharge count of the second battery, and store the mapping of the identification information of the second battery and the battery charge/discharge count of the second battery in the memory.

9. The electronic device of claim 8, wherein the at least one processor is further configured to execute the instructions to:
    identify whether each of the battery detachment count of the first battery and the battery detachment count of the second battery is greater than a predetermined number of times of detachment, or whether each of the battery charge/discharge count of the first battery and the battery charge/discharge count of the second battery is greater than a predetermined number of charge/discharge times;
    configure a display attribute of the first battery to a first display attribute based on at least one of the battery detachment count of the first battery being greater than the predetermined number of times of detachment and the battery charge/discharge count of the first battery being greater than the predetermined number of charge/discharge times, and configure the display attribute of the first battery to a second display attribute based on the battery detachment count of the first battery being equal to or less than the predetermined number of times of detachment and the battery charge/discharge count of the first battery being equal to less than the predetermined number of charge/discharge times; and
    configure a display attribute of the second battery to the first display attribute based on at least one of the battery detachment count of the second battery being greater than the predetermined number of times of detachment and the battery charge/discharge count of the second battery being greater than the predetermined number of charge/discharge times, and configure the display attribute of the second battery to the second display attribute based on the battery detachment count of the second battery being equal to or less than the predetermined number of times of detachment and the battery charge/discharge count of the second battery being equal to less than the predetermined number of charge/discharge times,
    wherein the first display attribute and the second display attribute are different.

10. The electronic device of claim 1, further comprising:
    a haptic module; and
    a sound output circuit,
    wherein the at least one processor is further configured to execute the instructions to: display, on the display though a user interface, a notification indicating replacement of the first battery, based on the remaining capacity information being equal to or less than the predetermined capacity, or based on the remaining capacity on the first battery being less than the remaining capacity on the second battery;
    display, on the display through the user interface, a notification indicating replacement of the second battery, based on the remaining capacity on the second battery being equal to or less than the predetermined capacity, or based on the remaining capacity on the second battery being less than the remaining capacity information on the first battery; and
    output at least one of the notification indicating the replacement of the first battery and the notification indicating the replacement of the second battery as at least one of a vibration through the haptic module and a sound through the sound output circuit.

11. A method of displaying information on a plurality of batteries of an electronic device comprising:
    displaying, via a display, integrated battery information on the plurality of batteries, based on remaining capacity information on the plurality of batteries,
    wherein the plurality of batteries comprise at least a first battery detachably disposed in a first internal space of a first housing of the electronic device, and a second battery detachably disposed in a second internal space of a second housing of the electronic device, and
    wherein the remaining capacity information on the plurality of batteries comprises at least a remaining capacity on the first battery and a remaining capacity on the second battery; and
    displaying, via the display, first battery information on the first battery and second battery information on the second battery, based on detecting that at least one of the remaining capacity on the first battery and the remaining capacity on the second battery is equal to or less than a predetermined capacity, or based on detecting a detachment of at least one of a first cover and a second cover by a sensor circuit, wherein the first cover is disposed on a rear surface of the first housing, and the second cover is disposed on a rear surface of the second housing.

12. The method of claim 11, wherein the displaying the first battery information on the first battery and the second battery information on the second battery further comprises:
    displaying, via the display, the first battery information on the first battery based on the remaining capacity on the first battery; and
    displaying, via the display, the second battery information on the second battery based on the remaining capacity on the second battery.

13. The method of claim 11, wherein the displaying the first battery information on the first battery and the second battery information on the second battery further comprises:
    configuring a display attribute for each of the first battery and the second battery to be different from each other; and
    displaying, via the display, the display attribute of the first battery and the display attribute of the second battery based on the differently configured display attributes,
    wherein the display attribute comprises at least one of a color, a visual effect, and a display size.

14. The method of claim 13, further comprising:
    comparing the remaining capacity on the first battery and the remaining capacity on the second battery based on detecting that the remaining capacity on the first battery and the remaining capacity on the second battery are greater than the predetermined capacity;

configuring the display attribute of the first battery and the display attribute of the second battery to be different from each other based on a result of the comparing; and displaying, on the display, battery information on a battery having a smaller remaining capacity among the first battery and the second battery and battery information on the other battery differently, based on the differently configured display attributes.

15. The method of claim 11, further comprising:

identifying battery state information of the plurality of batteries based on detecting that at least one of the remaining capacity on the first battery and the remaining capacity on the second battery is equal to or less than the predetermined capacity, or based on detecting the detachment of at least one of the first cover and the second cover, wherein the battery state information comprises at least state information on the first battery and state information on the second battery; and displaying, via the display, the first battery information on the first battery and the second battery information on the second battery based on at least one of the remaining capacity information and the battery state information.

16. The method of claim 15, wherein the battery state information comprises at least one of a battery detachment count and a battery charge/discharge count.

17. The method of claim 16, further comprising:

incrementing at least one of a battery detachment count of the first battery and a battery detachment count of the second battery based on detecting a detachment of at least one of the first battery and the second battery;

mapping identification information of the first battery and the battery detachment count of the first battery based on detecting the detachment of the first battery, and storing the mapping of the identification information of the first battery and the battery detachment count of the first battery in a memory; and mapping identification information of the second battery and the battery detachment count of the second battery based on detecting the detachment of the second battery, and storing the mapping of the identification information of the second battery and the battery detachment count of the second battery in the memory.

18. The method of claim 17, further comprising:

identifying a battery charge/discharge count of the first battery and a battery charge/discharge count of the second battery;

mapping the identification information of the first battery and the battery charge/discharge count of the first battery, and storing the mapping of the identification information of the first battery and the battery charge/discharge count of the first battery in the memory; and mapping the identification information of the second battery and the battery charge/discharge count of the second battery, and storing the mapping of the identification information of the second battery and the battery charge/discharge count of the second battery in the memory.

19. The method of claim 18, wherein the displaying the first battery information on the first battery and the second battery information on the second battery further comprises:

identifying whether each of the battery detachment count of the first battery and the battery detachment count of the second battery is greater than a predetermined number of times of detachment, or whether each of the battery charge/discharge count of the first battery and the battery charge/discharge count of the second battery is greater than a predetermined number of charge/discharge times;

configuring a display attribute of the first battery to a first display attribute based on at least one of the battery detachment count of the first battery being greater than the predetermined number of times of detachment and the battery charge/discharge count of the first battery being greater than the predetermined number of charge/discharge times, and configuring the display attribute of the first battery to a second display attribute based on the battery detachment count of the first battery being equal to or less than the predetermined number of times of detachment and the battery charge/discharge count of the first battery being equal to less than the predetermined number of charge/discharge times; and configuring a display attribute of the second battery to the first display attribute based on at least one of the battery detachment count of the second battery being greater than the predetermined number of times of detachment and the battery charge/discharge count of the second battery being greater than the predetermined number of charge/discharge times, and configuring the display attribute of the second battery to the second display attribute based on the battery detachment count of the second battery being equal to or less than the predetermined number of times of detachment and the battery charge/discharge count of the second battery being equal to less than the predetermined number of charge/discharge times, wherein the first display attribute and the second display attribute are different.

20. A non-transitory computer-readable storage medium storing a program that, when executed by at least one processor, causes the at least one processor to:

displaying, via a display, integrated battery information on a plurality of batteries, based on remaining capacity information on the plurality of batteries, wherein the plurality of batteries comprise at least a first battery detachably disposed in a first internal space of a first housing of an electronic device, and a second battery detachably disposed in a second internal space of a second housing of the electronic device, and wherein the remaining capacity information on the plurality of batteries comprises at least a remaining capacity on the first battery and a remaining capacity on the second battery; and displaying, via the display, first battery information on the first battery and second battery information on the second battery, based on detecting that at least one of the remaining capacity on the first battery and the remaining capacity on the second battery is equal to or less than a predetermined capacity, or based on detecting a detachment of at least one of a first cover and a second cover by a sensor circuit, wherein the first cover is disposed on a rear surface of the first housing, and the second cover is disposed on a rear surface of the second housing.

* * * * *